(12) United States Patent  
Miyake et al.

(10) Patent No.: US 9,734,780 B2  
(45) Date of Patent: Aug. 15, 2017

(54) DRIVING METHOD OF LIQUID CRYSTAL DISPLAY DEVICE

(75) Inventors: Hiroyuki Miyake, Atsugi (JP); Hideaki Shishido, Atsugi (JP); Ryo Arasawa, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 683 days.

(21) Appl. No.: 13/111,278

(22) Filed: May 19, 2011

(65) Prior Publication Data

US 2012/0001881 A1     Jan. 5, 2012

(30) Foreign Application Priority Data

Jul. 1, 2010    (JP) ................................. 2010-150889

(51) Int. Cl.
| | |
|---|---|
| G09G 3/36 | (2006.01) |
| G06F 3/038 | (2013.01) |
| H01L 27/12 | (2006.01) |
| H01L 29/02 | (2006.01) |

(52) U.S. Cl.
CPC ........... *G09G 3/3648* (2013.01); *G06F 3/038* (2013.01); *G09G 3/3614* (2013.01); *H01L 27/1225* (2013.01); *H01L 29/02* (2013.01)

(58) Field of Classification Search
CPC combination set(s) only.
See application file for complete search history.

(56) References Cited

U.S. PATENT DOCUMENTS

| | | |
|---|---|---|
| 5,731,856 A | 3/1998 | Kim et al. |
| 5,744,824 A | 4/1998 | Kousai et al. |
| 5,744,864 A | 4/1998 | Cillessen et al. |
| 5,798,746 A | 8/1998 | Koyama |
| 6,294,274 B1 | 9/2001 | Kawazoe et al. |

(Continued)

FOREIGN PATENT DOCUMENTS

| | | |
|---|---|---|
| EP | 1102111 A | 5/2001 |
| EP | 1737044 A | 12/2006 |

(Continued)

OTHER PUBLICATIONS

Machine translation of Japan 07219484 published Aug. 18, 1995 by Masami Oda.*

(Continued)

*Primary Examiner* — Jonathan Boyd
(74) *Attorney, Agent, or Firm* — Eric J. Robinson; Robinson Intellectual Property Law Office, P.C.

(57) ABSTRACT

An object is to provide a driving method of a liquid crystal display device with a low power consumption and a high image quality. A pixel includes a liquid crystal element and a transistor which controls supply of an image signal to the liquid crystal element. The transistor includes, in a channel formation region, a semiconductor which has a wider band gap than a silicon semiconductor and has a lower intrinsic carrier density than silicon, and has an extremely low off-state current. In inversion driving of pixels, image signals having opposite polarities are input to a pair of signal lines between which a pixel electrode is disposed. By employing such a structure, the quality of the displayed image can be increased even in the absence of a capacitor in the pixel.

35 Claims, 17 Drawing Sheets

(56) References Cited

U.S. PATENT DOCUMENTS

| | | |
|---|---|---|
| 6,563,174 B2 | 5/2003 | Kawasaki et al. |
| 6,636,280 B1 | 10/2003 | Miyazawa et al. |
| 6,727,522 B1 | 4/2004 | Kawasaki et al. |
| 6,828,585 B2 | 12/2004 | Ueda |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,286,108 B2 | 10/2007 | Tsuda et al. |
| 7,297,977 B2 | 11/2007 | Hoffman et al. |
| 7,315,335 B2 | 1/2008 | Miyazawa et al. |
| 7,321,353 B2 | 1/2008 | Tsuda et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,515,325 B2 | 4/2009 | Nakamura |
| 7,601,984 B2 | 10/2009 | Sano et al. |
| 7,674,650 B2 | 3/2010 | Akimoto et al. |
| 7,687,808 B2 | 3/2010 | Umezaki |
| 7,732,819 B2 | 6/2010 | Akimoto et al. |
| 7,777,825 B2 | 8/2010 | Noda et al. |
| 7,791,072 B2 | 9/2010 | Kumomi et al. |
| 7,791,074 B2 | 9/2010 | Iwasaki |
| 7,857,907 B2 | 12/2010 | Cho et al. |
| 7,906,777 B2 | 3/2011 | Yano et al. |
| 7,907,224 B2 | 3/2011 | Ito et al. |
| 7,910,490 B2 | 3/2011 | Akimoto et al. |
| 7,924,276 B2 | 4/2011 | Tsuda et al. |
| 7,935,582 B2 | 5/2011 | Iwasaki |
| 7,964,876 B2 | 6/2011 | Umezaki |
| 7,994,500 B2 | 8/2011 | Kim et al. |
| 8,058,645 B2 | 11/2011 | Jeong et al. |
| 8,084,331 B2 | 12/2011 | Ofuji et al. |
| 8,129,717 B2 | 3/2012 | Yamazaki et al. |
| 8,129,719 B2 | 3/2012 | Yamazaki et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,461,007 B2 | 6/2013 | Yamazaki |
| 8,461,583 B2 | 6/2013 | Yano et al. |
| 8,530,246 B2 | 9/2013 | Ofuji et al. |
| 8,598,591 B2 | 12/2013 | Umezaki |
| 8,723,175 B2 | 5/2014 | Yano et al. |
| 8,791,457 B2 | 7/2014 | Yano et al. |
| 9,293,088 B2 | 3/2016 | Yoshida et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0051103 A1* | 3/2004 | Hong et al. .............. 257/72 |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0057261 A1 | 3/2007 | Jeong et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0151132 A1 | 6/2008 | Oura et al. |
| 2008/0166834 A1 | 7/2008 | Kim et al. |
| 2008/0179762 A1 | 7/2008 | Cho et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0284933 A1* | 11/2008 | Ito et al. .............. 349/43 |
| 2008/0284935 A1* | 11/2008 | Takahashi et al. .............. 349/46 |
| 2008/0291350 A1* | 11/2008 | Hayashi et al. .............. 349/47 |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0009675 A1 | 1/2009 | Cho et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0167663 A1 | 7/2009 | Ker et al. |
| 2009/0194766 A1 | 8/2009 | Park et al. |
| 2009/0278122 A1 | 11/2009 | Hosono et al. |
| 2009/0280600 A1 | 11/2009 | Hosono et al. |
| 2009/0294772 A1 | 12/2009 | Jeong et al. |
| 2009/0305461 A1 | 12/2009 | Akimoto et al. |
| 2010/0065844 A1 | 3/2010 | Tokunaga |
| 2010/0072467 A1 | 3/2010 | Yamazaki et al. |
| 2010/0072468 A1 | 3/2010 | Yamazaki et al. |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0148169 A1 | 6/2010 | Kim et al. |
| 2010/0149138 A1 | 6/2010 | Lee et al. |
| 2010/0276689 A1 | 11/2010 | Iwasaki |
| 2010/0279462 A1 | 11/2010 | Iwasaki |
| 2010/0295041 A1 | 11/2010 | Kumomi et al. |
| 2010/0296020 A1 | 11/2010 | Noda et al. |

(56) References Cited

U.S. PATENT DOCUMENTS

| | | |
|---|---|---|
| 2010/0320458 A1 | 12/2010 | Umeda et al. |
| 2010/0320459 A1 | 12/2010 | Umeda et al. |
| 2011/0003429 A1 | 1/2011 | Oikawa et al. |
| 2011/0079778 A1 | 4/2011 | Yamazaki et al. |
| 2011/0090416 A1 | 4/2011 | Arasawa et al. |
| 2011/0101335 A1 | 5/2011 | Yamazaki et al. |
| 2011/0115763 A1 | 5/2011 | Yamazaki et al. |
| 2011/0133183 A1 | 6/2011 | Yamazaki et al. |
| 2011/0148846 A1 | 6/2011 | Arasawa et al. |
| 2011/0193083 A1 | 8/2011 | Kim et al. |
| 2011/0215328 A1 | 9/2011 | Morosawa et al. |
| 2011/0215331 A1* | 9/2011 | Yamazaki et al. ............. 257/60 |
| 2011/0260171 A1 | 10/2011 | Yamazaki |
| 2011/0263082 A1 | 10/2011 | Yamazaki |
| 2011/0263083 A1 | 10/2011 | Yamazaki |
| 2011/0263084 A1 | 10/2011 | Yamazaki |
| 2011/0263091 A1 | 10/2011 | Yamazaki |
| 2012/0001170 A1 | 1/2012 | Yamazaki |
| 2012/0018727 A1 | 1/2012 | Endo et al. |
| 2012/0108006 A1 | 5/2012 | Yamazaki et al. |
| 2012/0108007 A1 | 5/2012 | Yamazaki et al. |
| 2012/0119205 A1 | 5/2012 | Taniguchi et al. |
| 2013/0126862 A1 | 5/2013 | Yamazaki |
| 2013/0146870 A1 | 6/2013 | Yamazaki |
| 2014/0061638 A1 | 3/2014 | Umezaki |

FOREIGN PATENT DOCUMENTS

| | | |
|---|---|---|
| EP | 1 764 839 | 3/2007 |
| EP | 2226847 A | 9/2010 |
| JP | 60-156095 A | 8/1985 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-121712 A | 4/1992 |
| JP | 04-237092 A | 8/1992 |
| JP | 05-251705 A | 9/1993 |
| JP | 07-219484 | 8/1995 |
| JP | 08-264794 A | 10/1996 |
| JP | 10-274782 | 10/1998 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-323707 A | 11/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165527 A | 6/2006 |
| JP | 2006-165528 A | 6/2006 |
| JP | 2006-165529 A | 6/2006 |
| JP | 2007-081362 | 3/2007 |
| JP | 2007-081632 A | 3/2007 |
| JP | 2007-096055 A | 4/2007 |
| JP | 2007-103918 A | 4/2007 |
| JP | 2007-123861 A | 5/2007 |
| JP | 2007-142196 A | 6/2007 |
| JP | 2007-219484 a | 8/2007 |
| JP | 2007-220820 A | 8/2007 |
| JP | 2008-089874 A | 4/2008 |
| JP | 2008-277665 A | 11/2008 |
| JP | 2008-286911 A | 11/2008 |
| JP | 2008-544522 | 12/2008 |
| JP | 2009-167087 A | 7/2009 |
| JP | 2009-212443 A | 9/2009 |
| JP | 2009-231613 | 10/2009 |
| JP | 2009-277702 A | 11/2009 |
| JP | 2010-016347 | 1/2010 |
| JP | 4415062 | 2/2010 |
| JP | 2010-067954 | 3/2010 |
| JP | 2010-098304 A | 4/2010 |
| JP | 2010-098305 | 4/2010 |
| JP | 2010-122669 A | 6/2010 |
| JP | 2010-177431 | 8/2010 |
| JP | 4571221 | 10/2010 |
| JP | 2011-097103 | 5/2011 |
| JP | 2012-160679 | 8/2012 |
| KR | 2007-0031165 | 3/2007 |
| TW | 270223 | 2/1996 |
| TW | 544936 | 8/2003 |
| TW | 594355 | 6/2004 |
| TW | 1312219 | 7/2009 |
| TW | 200929149 | 7/2009 |
| TW | 201011923 | 3/2010 |
| WO | WO-2004/114391 | 12/2004 |
| WO | WO 2006/064789 | 6/2006 |
| WO | WO-2006/138072 | 12/2006 |
| WO | WO 2007/029844 | 3/2007 |
| WO | WO-2008/133345 | 11/2008 |
| WO | WO-2009/081885 | 7/2009 |
| WO | WO-2009/110623 | 9/2009 |
| WO | WO-2010/032629 | 3/2010 |
| WO | WO 2010/032640 | 3/2010 |

OTHER PUBLICATIONS

International Search Report (Application No. PCT/JP2011/060690) Dated Aug. 16, 2011.

Written Opinion (Application No. PCT/JP2011/060690) Dated Aug. 16, 2011.

Invitation to pay additional fees (Application No. PCT/JP2011/060690), International Searching Authority, Dated Jun. 21, 2011.

International Search Report (Application No. PCT/JP2010/067498) dated Dec. 28, 2010.

Written Opinion (Application No. PCT/JP2010/067498) dated Dec. 28, 2010.

Shishido et al., "High Aperture Ratio LCD Display using In—Ga—Zn—Oxide TFTs without Storage Capacitor," SID 10 Digest, 41, 1128-1131 (2010).

Nakayama et al., "17a-TL-8 Effect of GaO Layer on IGZO-TFT Channel," Extended Abstracts (The 57th Spring Meeting 2010), The Japan Society of Applied Physics and Related Societies, Mar. 17, 2010, pp. 21-008.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

(56) References Cited

OTHER PUBLICATIONS

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT, ", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

(56) References Cited

OTHER PUBLICATIONS

Kimizuka.N. et al., "Spinel,YbFe2O4, and Yb2Fe3O7 Types of Structures for Compounds in the In2O3 and Sc2O3 and Sc2O3—A2O3—BO Systems [A; Fe, Ga, or Al; B: Mg, Mn, Fe, Ni, Cu,or Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m <4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Taiwanese Office Action (Application No. 100116766) Dated Oct. 13, 2015.

Taiwanese Office Action (Application No. 105100942) Dated Sep. 21, 2016.

Korean Office Action (Application No. 2012-7033145) Dated Feb. 28, 2017.

Godo.H et al., "Temperature Dependence of Transisotr Characteristics and Electronic Structure for Amorphous In—Ga—Zn—Oxide Thin Film Transistor", Jpn. J. Appl. Phys. (Japanese Journal of Applied Physics), Mar. 1, 2010, vol. 49, No. 3. pp. 03CB04-1-03CB04-6.

\* cited by examiner

| | First frame period | + | − |
| | ↓ | ↓ | ↓ |
| | Second frame period | − | + |
| | ↓ | ↓ | ↓ |
| | Third frame period | + | − |

DRIVING METHOD OF LIQUID CRYSTAL DISPLAY DEVICE

TECHNICAL FIELD

The present invention relates to a driving method of an active-matrix liquid crystal display device including a transistor in a pixel.

BACKGROUND ART

In recent years, a metal oxide having semiconductor characteristics, which is called an oxide semiconductor, has attracted attention as a novel semiconductor material for a semiconductor element having high mobility provided by polysilicon or microcrystalline silicon and having uniform element characteristics provided by amorphous silicon. The metal oxide is used for various applications; for example, indium oxide is a well-known metal oxide and used as a material of a pixel electrode in a liquid crystal display device. Examples of such a metal oxide having semiconductor characteristics include tungsten oxide, tin oxide, indium oxide, and zinc oxide. Transistors in which a channel formation region is formed using such a metal oxide having semiconductor characteristics have been already known (Patent Documents 1 and 2).

REFERENCE

Patent Document

[Patent Document 1] Japanese Published Patent Application No. 2007-123861
[Patent Document 2] Japanese Published Patent Application No. 2007-96055

DISCLOSURE OF INVENTION

Low power consumption is one of the important points in terms of evaluating performance of a semiconductor display device, and a liquid crystal display device is no exception in that point. In particular, when a portable electronic device such as a cellular phone is used, large power consumption of a liquid crystal display device leads to a disadvantage of short continuous operation time; therefore, low power consumption is required.

In the case of a transmissive liquid crystal display device, if the percentage of a region transmitting light in a pixel, that is, the aperture ratio is increased, light emitted from a backlight can be efficiently utilized; accordingly, power consumption can be reduced. However, if priority is put on the increase in the aperture ratio when determining the pixel layout, the size of a semiconductor element such as a transistor or a capacitor included in the pixel needs to be reduced. When the capacitance of a capacitor is reduced, the period for which the potential of an image signal can be held is shortened; accordingly, the quality of the displayed image is lowered.

In consideration of the above-described problems, it is an object of an embodiment of the present invention to provide a driving method of a liquid crystal display device which can realize a reduction in the power consumption with the image quality prevented from being lowered.

In an embodiment of the present invention, a pixel includes a liquid crystal element and a transistor which controls supply of an image signal to the liquid crystal element. Further, in an embodiment of the present invention, the transistor is an insulated-gate field effect transistor (hereinafter simply referred to as a transistor) having an extremely low off-state current. The transistor includes, in a channel formation region, a semiconductor material which has a wider band gap than a silicon semiconductor and has a lower intrinsic carrier density than silicon. With a channel formation region including a semiconductor material having the above-described characteristics, a transistor with an extremely low off-state current and a high withstand voltage can be realized. As an example of such a semiconductor material, an oxide semiconductor having a band gap which is approximately twice or more as large as that of silicon can be given.

In an embodiment of the present invention, by using a transistor having an extremely low off-state current in a pixel, the potential of an image signal can be held for a longer period as compared to the case of using a transistor formed using a normal semiconductor material such as silicon or germanium. Therefore, without a capacitor for holding a potential of an image signal connected to a liquid crystal element, the quality of the displayed image can be prevented from being lowered.

Note that parasitic capacitance is formed between a pixel electrode of the liquid crystal element and a signal line for inputting an image signal to the pixel. In the case of not connecting a capacitor to the liquid crystal element, the potential of the pixel electrode is easily affected by the parasitic capacitance. Accordingly, there easily occurs a phenomenon called crosstalk in which when the potential of the signal line is changed in the period during which the potential of the image signal is held, the potential of the pixel electrode also fluctuates accordingly. The crosstalk lowers the contrast.

In view of this problem, in an embodiment of the present invention, in inversion driving of a pixel, image signals having opposite polarities are input to a pair of signal lines between which a pixel electrode is positioned. Note that the "image signals having opposite polarities" means that, on the assumption that the potential of a counter electrode of the liquid crystal element is a reference potential, one of the image signals has a potential higher than the reference potential and the other has a potential lower than the reference potential.

Specifically, source line inversion is performed in which image signals having opposite polarities are input in one given frame period so that the polarity of image signals input to a plurality of pixels connected to one signal line and the polarity of image signals input to a plurality of pixels connected to a signal line that is adjacent to the above-described signal line are opposite to each other. Alternatively, dot inversion is performed in which image signals having opposite polarities are input in one given frame period to a plurality of pixels connected to one signal line so that, in the plurality of pixels connected to the one signal line, the polarity of an image signal input to a pixel and a polarity of an image signal input to a pixel adjacent to the pixel are opposite to each other and, in addition, the image signals having opposite polarities are input so that a polarity of image signals input to a plurality of pixels connected to one signal line and a polarity of image signals input to a plurality of pixels located adjacent to the plurality of pixels and connected to a signal line adjacent to the signal line are opposite to each other.

By the inversion driving as described above, the potentials of the pair of signal lines adjacent to each other change in opposite polarity directions, whereby the fluctuation of the potentials of the pixel electrodes can be balanced out. Therefore, generation of crosstalk can be suppressed.

Note that an oxide semiconductor (purified OS) purified by reduction of impurities such as moisture or hydrogen which serves as an electron donor (donor) is an intrinsic (i-type) semiconductor or a substantially i-type semiconductor. Therefore, a transistor including the oxide semiconductor has a characteristic of very low off-state current. Specifically, the hydrogen concentration in the purified oxide semiconductor which is measured by secondary ion mass spectrometry (SIMS) is reduced to less than or equal to $5 \times 10^{19}/cm^3$, preferably less than or equal to $5 \times 10^{18}/cm^3$, further preferably less than or equal to $5 \times 10^{17}/cm^3$, still further preferably less than or equal to $1 \times 10^{16}/cm^3$. By the reduction of the impurity concentration, the carrier density of the oxide semiconductor film, which is measured by Hall effect measurement, can be reduced to less than $1 \times 10^{14}/cm^3$, less than $1 \times 10^{12}/cm^3$, or less than $1 \times 10^{11}/cm^3$. Furthermore, the band gap of the oxide semiconductor can be 2 eV or more, 2.5 eV or more, or 3 eV or more. With the use of the oxide semiconductor film which is purified by sufficiently reducing the concentration of impurities such as moisture or hydrogen, off-state current of the transistor can be reduced.

The analysis of the hydrogen concentration in the oxide semiconductor film is described here. The hydrogen concentration in the oxide semiconductor film and a conductive film is measured by secondary ion mass spectrometry (SIMS). Because of the principle of the SIMS analysis, it is known to be difficult to obtain accurate data in the proximity of a surface of a sample or in the proximity of an interface between stacked films formed of different materials. Thus, in the case where the distribution of the hydrogen concentration in the thickness direction of a film is analyzed by SIMS, the average value of the hydrogen concentration in a region of the film where almost the same value can be obtained without significant variation is employed as the hydrogen concentration. Further, in the case where the thickness of the film is small, a region where almost the same value can be obtained cannot be found in some cases due to the influence of the hydrogen concentration of an adjacent film. In this case, the maximum value or the minimum value of the hydrogen concentration of a region where the film is provided is employed as the hydrogen concentration of the film. Furthermore, in the case where a maximum value peak and a minimum value valley do not exist in the region where the films are provided, the value of the inflection point is employed as the hydrogen concentration.

Various experiments can actually prove low off-state current of the transistor including the purified oxide semiconductor film as an active layer. For example, even in the case of an element with a channel width of $1 \times 10^6$ μm and a channel length of 10 μm, in a range of from 1 V to 10 V of voltage (drain voltage) between a source electrode and a drain electrode, it is possible to obtain an off-state current (which is drain current in the case where voltage between a gate electrode and the source electrode is 0 V or less) of less than or equal to the measurement limit of a semiconductor parameter analyzer, that is, less than or equal to $1 \times 10^{-13}$ A. In this case, it can be found that an off-state current density corresponding to a value obtained by dividing the off-state current by the channel width of the transistor is less than or equal to 100 zA/μm. Further, an off-state current density has been measured with the use of a circuit in which a capacitor and a transistor are connected to each other and charge that inflows in the capacitor or outflows from the capacitor is controlled by the transistor. In the measurement, a purified oxide semiconductor film has been used for a channel formation region of the transistor, and an off-state current density of the transistor has been measured from a change in the amount of charge of the capacitor per unit time. As a result, it has been found that, in the case where the voltage between the source electrode and the drain electrode of the transistor is 3 V, a lower off-state current density of several tens of yA/μm is obtained. Thus, in a semiconductor device according to an embodiment of the present invention, the off-state current density of a transistor in which a purified oxide semiconductor film is used as an active layer can be set to less than or equal to 100 yA/μm, preferably less than or equal to 10 yA/μm, further preferably less than or equal to 1 yA/μm depending on the voltage between a source electrode and a drain electrode. Accordingly, the off-state current of the transistor in which the purified oxide semiconductor film is used as an active layer is considerably lower than that of a transistor in which silicon having crystallinity is used.

In addition, a transistor including a purified oxide semiconductor shows almost no temperature dependence of off-state current. This is because the conductivity type is made to be as close to an intrinsic type as possible by removing impurities, which serve as electron donors (donors) in the oxide semiconductor, to purify the oxide semiconductor, so that the Fermi level is located in a center of the forbidden band. This also results from the fact that the oxide semiconductor has an energy gap of 3 eV or more and includes very few thermally excited carriers. In addition, the source electrode and the drain electrode are in a degenerated state, which is also a factor for showing no temperature dependence. The transistor is mostly operated with carriers injected into the oxide semiconductor from the degenerated source electrode and the carrier density has no dependence on temperature; therefore, the off-state current has no dependence on temperature.

As the oxide semiconductor, a four-component metal oxide such as an In—Sn—Ga—Zn—O-based oxide semiconductor, a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor, or a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, an In—Ga—O-based oxide semiconductor, an In—O-based oxide semiconductor, a Sn—O-based oxide semiconductor, and a Zn—O-based oxide semiconductor, and the like can be used. In this specification, the term "In—Sn—Ga—Zn—O-based oxide semiconductor" means a metal oxide containing indium (In), tin (Sn), gallium (Ga), and zinc (Zn) and may have any stoichiometric ratio. In addition, the oxide semiconductor may contain silicon.

The oxide semiconductor may be expressed by a chemical formula, $InMO_3(ZnO)_m$, (m>0, m is not necessarily a natural number). Here, M represents one or more metal elements selected from Ga, Al, Mn, and Co.

In an embodiment of the present invention, a transistor having an extremely low off-state current is used in a pixel, whereby the quality of the displayed image can be prevented from being lowered without connecting a capacitor to a liquid crystal element. Therefore, the aperture ratio can be increased and the power consumption can be reduced. Further in an embodiment of the present invention, source line inversion or dot inversion is employed, whereby crosstalk can be suppressed without using a capacitor and the image quality can be increased.

BRIEF DESCRIPTION OF DRAWINGS

In the accompanying drawings:

FIGS. 2A and 2B schematically show polarities of image signals supplied to pixels in the case of source line inversion driving;

FIGS. 3A and 3B schematically show polarities of image signals supplied to pixels in the case of dot inversion driving;

BEST MODE FOR CARRYING OUT THE INVENTION

Hereinafter, embodiments of the present invention will be described in detail with reference to the drawings. However, the present invention is not limited to the following description and it is easily understood by those skilled in the art that the mode and details can be variously changed without departing from the scope and spirit of the present invention. Therefore, the present invention should not be construed as being limited to the description of the following embodiments.

Embodiment 1

A liquid crystal display device used in a driving method according to an embodiment of the present invention includes a plurality of pixels, each of which is provided with a liquid crystal element and a transistor which controls supply of an image signal to the liquid crystal element. A plurality of scan lines for selecting the plurality of pixels and a plurality of signal lines for supplying image signals to the selected pixels are connected to the plurality of pixels.

Figure 1A:
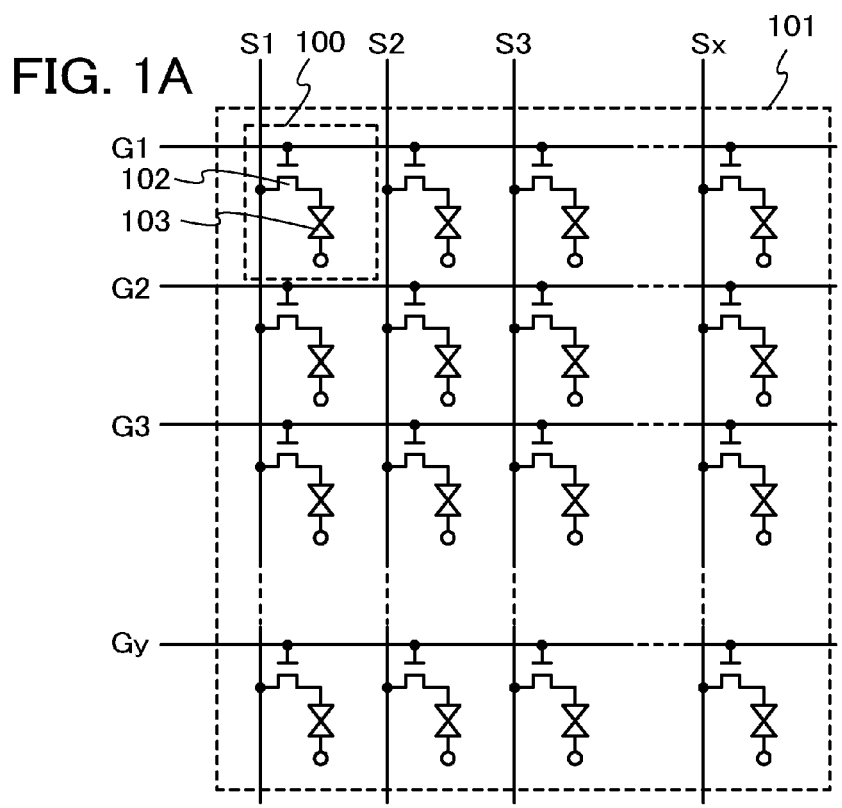
FIG. 1A is a circuit diagram of a pixel portion and FIG. 1B is a schematic diagram showing a driving method of the pixel portion.

FIG. 1A illustrates a structure of a pixel portion 101 including a plurality of pixels 100, as an example. In FIG. 1A, each of the pixels 100 includes at least one of signal lines S1 to Sx and at least one of scanning lines G1 to Gy. In addition, the pixel 100 includes a transistor 102 which functions as a switching element and a liquid crystal element 103. The liquid crystal element 103 includes a pixel electrode, a counter electrode, and a liquid crystal to which voltage between the pixel electrode and the counter electrode is applied.

The transistor 102 controls whether a potential of the signal line, that is, a potential of an image signal is applied to the pixel electrode of the liquid crystal element 103. A predetermined reference potential is applied to the counter electrode of the liquid crystal element 103.

A feature of an embodiment of the present invention is that a channel formation region of the transistor 102 includes a semiconductor whose band gap is wider than that of a silicon semiconductor and whose intrinsic carrier density is lower than that of silicon. As examples of the semiconductor, a compound semiconductor such as silicon carbide (SiC) or gallium nitride (GaN), an oxide semiconductor including a metal oxide such as zinc oxide (ZnO), and the like can be given. Among the above, an oxide semiconductor has an advantage of high mass productivity because an oxide semiconductor can be formed by sputtering, a wet process (e.g., a printing method), or the like. In addition, the oxide semiconductor film can be formed even at room temperature, whereas the process temperature of silicon carbide and the process temperature of gallium nitride are approximately 1500° C. and approximately 1100° C., respectively. Therefore, the oxide semiconductor can be formed over a glass substrate, which is inexpensively available, and it is possible to stack a semiconductor element formed using an oxide semiconductor over an integrated circuit including a semiconductor which does not have resistance enough to withstand heat treatment at a high temperature of 1500° C. to 2000° C. In addition, larger substrates can be used. Accordingly, among the semiconductors, the oxide semiconductor particularly has an advantage of high mass productivity. Further, in the case where an oxide semiconductor with crystallinity is used in order to improve the property of a transistor (e.g., field-effect mobility), the oxide semiconductor with crystallinity can be easily obtained by heat treatment at 250° C. to 800° C.

In the following description, a case in which an oxide semiconductor having the above advantages is used as the semiconductor having a wide bandgap is given as an example.

When a semiconductor material having the above-described characteristics is included in a channel formation region, the transistor 102 can have an extremely low off-state current and a high withstand voltage. Further, when the transistor 102 having the above-described structure is used as a switching element, leakage of electric charge accumulated in the liquid crystal element 103 can be prevented more effectively than the case of using a transistor including a normal semiconductor material such as silicon or germanium. Accordingly, the potential of an image signal can be held for a longer period, so that without a capacitor for holding a potential of an image signal connected to the liquid crystal element 103, the quality of the displayed image can be prevented from being lowered. Thus, it is possible to increase the aperture ratio by reducing the size of a capacitor or by not providing a capacitor. Therefore, power consumption of the liquid crystal display device can be reduced.

Note that in this specification, a capacitor is distinguished from a capacitance originating from the liquid crystal element itself.

Unless otherwise specified, in the case of an n-channel transistor, the off-state current in this specification is a current which flows between a source electrode and a drain electrode when, in the state where the potential of the drain electrode is higher than that of the source electrode and that of a gate electrode, the potential of the gate electrode is less than or equal to zero when the potential of the source electrode is a reference potential. Alternatively, in this specification, in the case of a p-channel transistor, the off-state current is a current which flows between a source electrode and a drain electrode when, in the state where the potential of the drain electrode is lower than that of the source electrode or that of a gate electrode, the potential of the gate electrode is greater than or equal to zero when the potential of the source electrode is a reference potential.

The names of the "source electrode" and the "drain electrode" included in the transistor interchange with each other depending on the polarity of the transistor or difference between the potentials applied to the respective electrodes. In general, in an n-channel transistor, an electrode to which a lower potential is applied is called a source electrode, and an electrode to which a higher potential is applied is called a drain electrode. Further, in a p-channel transistor, an electrode to which a lower potential is applied is called a drain electrode, and an electrode to which a higher potential is applied is called a source electrode. A specific connection relation of the transistor 102 and the liquid crystal element 103 will be described below on the assumption that one of a source electrode and a drain electrode is a first terminal and the other is a second terminal.

A gate electrode of the transistor 102 is connected to any one of scan lines G1 to Gy. The first terminal of the transistor 102 is connected to any one of signal lines S1 to Sx, and the second terminal of the transistor 102 is connected to the pixel electrode of the liquid crystal element 103.

Note that the pixel 100 may further have another circuit element such as a transistor, a diode, a resistor, a capacitor, or an inductor as needed.

Note that FIG. 1A illustrates a case where one transistor 102 is used as a switching element in the pixel 100; however, an embodiment of the present invention is not limited to this structure. A plurality of transistors may be used as switching elements. In the case where a plurality of transistors functions as switching elements, the plurality of transistors may be connected to each other in parallel, in series, or in combination of parallel connection and series connection.

In this specification, the state in which the transistors are connected to each other in series, for example, means a state in which only one of a first terminal and a second terminal of a first transistor is connected to only one of a first terminal and a second terminal of a second transistor. Further, the state in which the transistors are connected to each other in parallel means a state in which the first terminal of the first transistor is connected to the first terminal of the second transistor and the second terminal of the first transistor is connected to the second terminal of the second transistor.

Note that the term "connection" in this specification refers to electrical connection and corresponds to the state in which current, voltage, or a potential can be supplied or transmitted. Accordingly, a connection state means not only a state of a direct connection but also a state of indirect connection through a circuit element such as a wiring, a resistor, a diode, or a transistor so that current, voltage, or a potential can be supplied or transmitted.

Even when a circuit diagram illustrates independent components which are connected to each other, there is a case where one conductive film has functions of a plurality of components such as the case where part of a wiring functions as an electrode. In this specification, the term "connection" also means such a case where one conductive film has functions of a plurality of components.

Figure 1B:
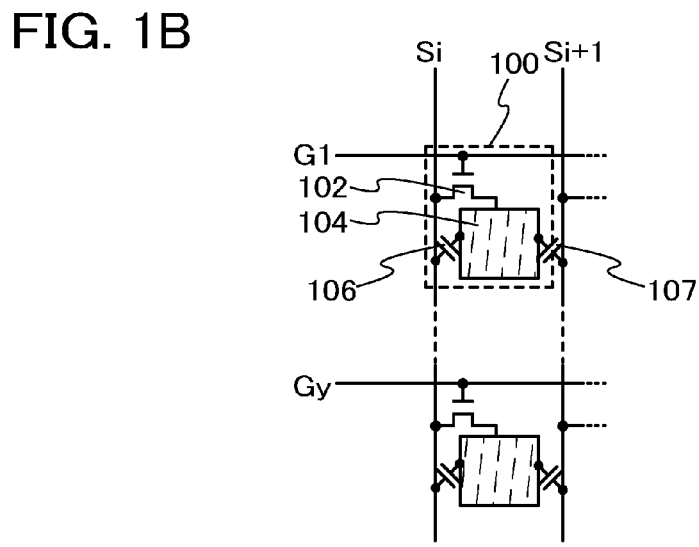

FIG. 1B illustrates a structure of the pixels 100 in one column, which are connected to a signal line Si (i is any number of 1 to x−1). Unlike FIG. 1A, FIG. 1B illustrates a pixel electrode 104 included in the liquid crystal element 103, instead of illustrating the liquid crystal element 103.

In the pixel 100 to which the signal line Si is connected, the pixel electrode 104 is positioned between the signal line Si and a signal line Si+1 that is adjacent to the signal line Si. If the transistor 102 is off, it is ideal that the pixel electrode 104 and the signal line Si are electrically separated from each other. Further, ideally, the pixel electrode 104 and the signal line Si+1 are electrically separated from each other. However, there actually exist a parasitic capacitance 106 between the pixel electrode 104 and the signal line Si, and a parasitic capacitance 107 between the pixel electrode 104 and the signal line Si+1.

In the case where a capacitor is not connected to the liquid crystal element 103, or in the case where a capacitor connected to the liquid crystal element 103 has a small capacitance value, the potential of the pixel electrode 104 is easily affected by the parasitic capacitance 106 and the parasitic capacitance 107. Therefore, even when the transistor 102 is in an off state in a period during which a potential of an image signal is held, there easily occurs a phenomenon called crosstalk in which the potential of the pixel electrode 104 fluctuates owing to the change in the potential of the signal line Si or the signal line Si+1. Therefore, in the case of using a normally-white liquid crystal element as the liquid crystal element 103, images are whitish and the contrast is low.

In an embodiment of the present invention, in view of the above situation, image signals having opposite polarities are input to the signal line Si and the signal line Si+1 between which the pixel electrode 104 is disposed, in one given frame period.

For example, as illustrated in FIG. 1B, in the first frame period, an image signal having a positive (+) polarity is input to the signal line Si and an image signal having a negative (−) polarity is input to the signal line Si+1. Next, in the second frame period, an image signal having a negative (−) polarity is input to the signal line Si and an image signal having a positive (+) polarity is input to the signal line Si+1. Then, in the third frame period, an image signal having a positive (+) polarity is input to the signal line Si and an image signal having a negative (−) polarity is input to the signal line Si+1.

When image signals having polarities opposite to each other are input to the signal line Si and the signal line Si+1 in this manner, a fluctuation in the potential of the pixel electrode 104 which is caused by a change in the potential of the signal line Si and a fluctuation in the potential of the pixel electrode 104 which is caused by a change in the potential of the signal line Si+1 work in opposite directions and are balanced out. As a result, even in the case where a capacitor is not connected to the liquid crystal element 103 or even in the case where a capacitor connected to the liquid crystal element 103 has a small capacitance value, the fluctuation in the potential of the pixel electrode 104 can be suppressed to be small. Accordingly, generation of crosstalk is suppressed and the image quality can be increased.

Note that as a driving method for inputting image signals having polarities opposite to each other to adjacent signal lines, there are a source line inversion driving method and a dot inversion driving method.

Figures 2A, 2B:
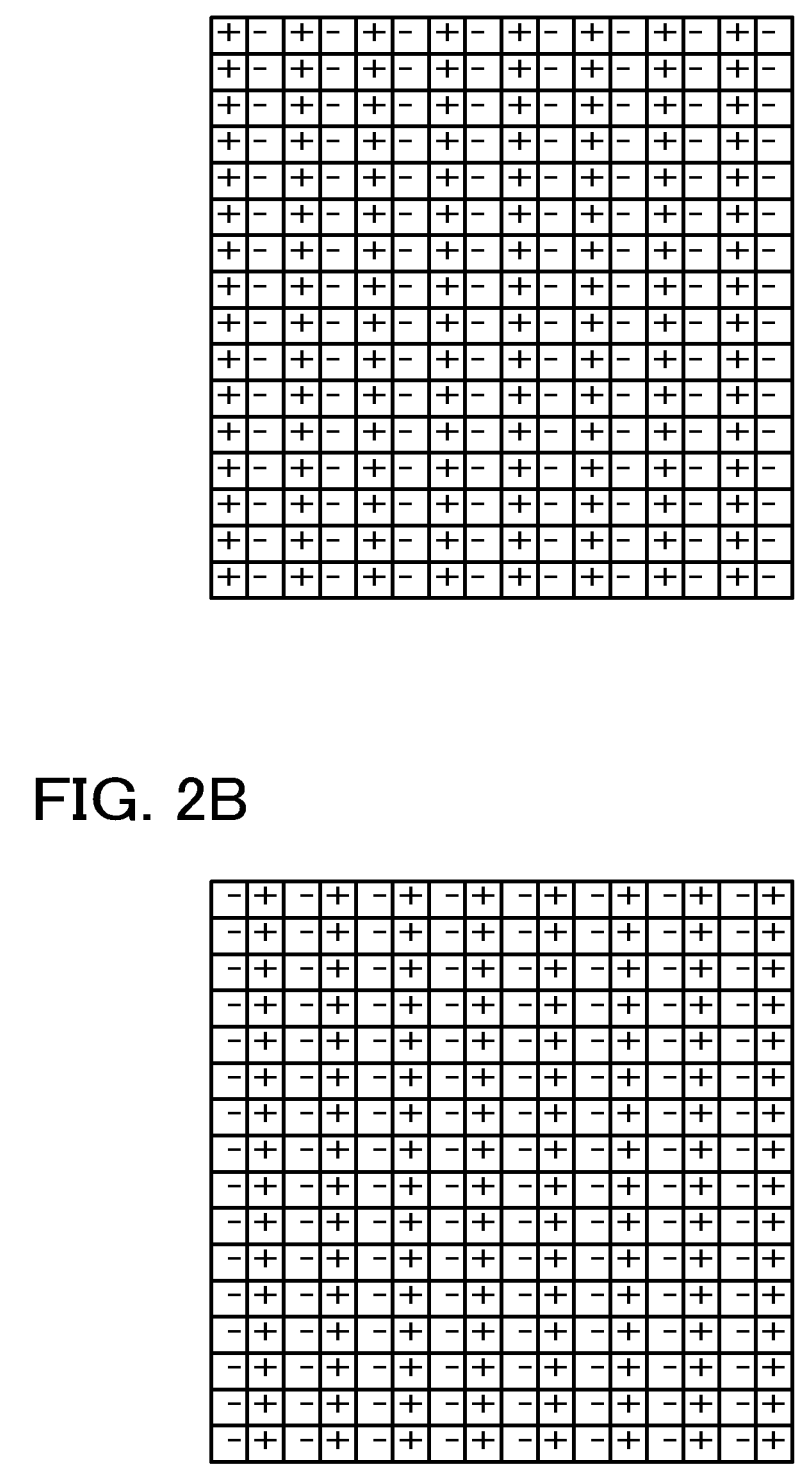

FIGS. 2A and 2B schematically show polarities of image signals supplied to pixels in the case of source line inversion driving. In FIG. 2A, "+" indicates a pixel to which an image signal having a positive polarity is supplied in one given frame period. Further in FIG. 2A, "−" indicates a pixel to which an image signal having a negative polarity is supplied in the given frame period. In FIG. 2B, "+" indicates a pixel to which an image signal having a positive polarity is supplied in a frame period next to the frame period of FIG. 2A. Further in FIG. 2B, "−" indicates a pixel to which an image signal having a negative polarity is supplied in the frame period next to the frame period of FIG. 2A.

In the source line inversion driving, image signals having the same polarity are supplied to all of plural pixels connected to the same signal line, as illustrated in FIGS. 2A and 2B. In addition, image signals having the polarity opposite to the above polarity are supplied to all of plural pixels connected to the adjacent signal line.

Figures 3A, 3B:
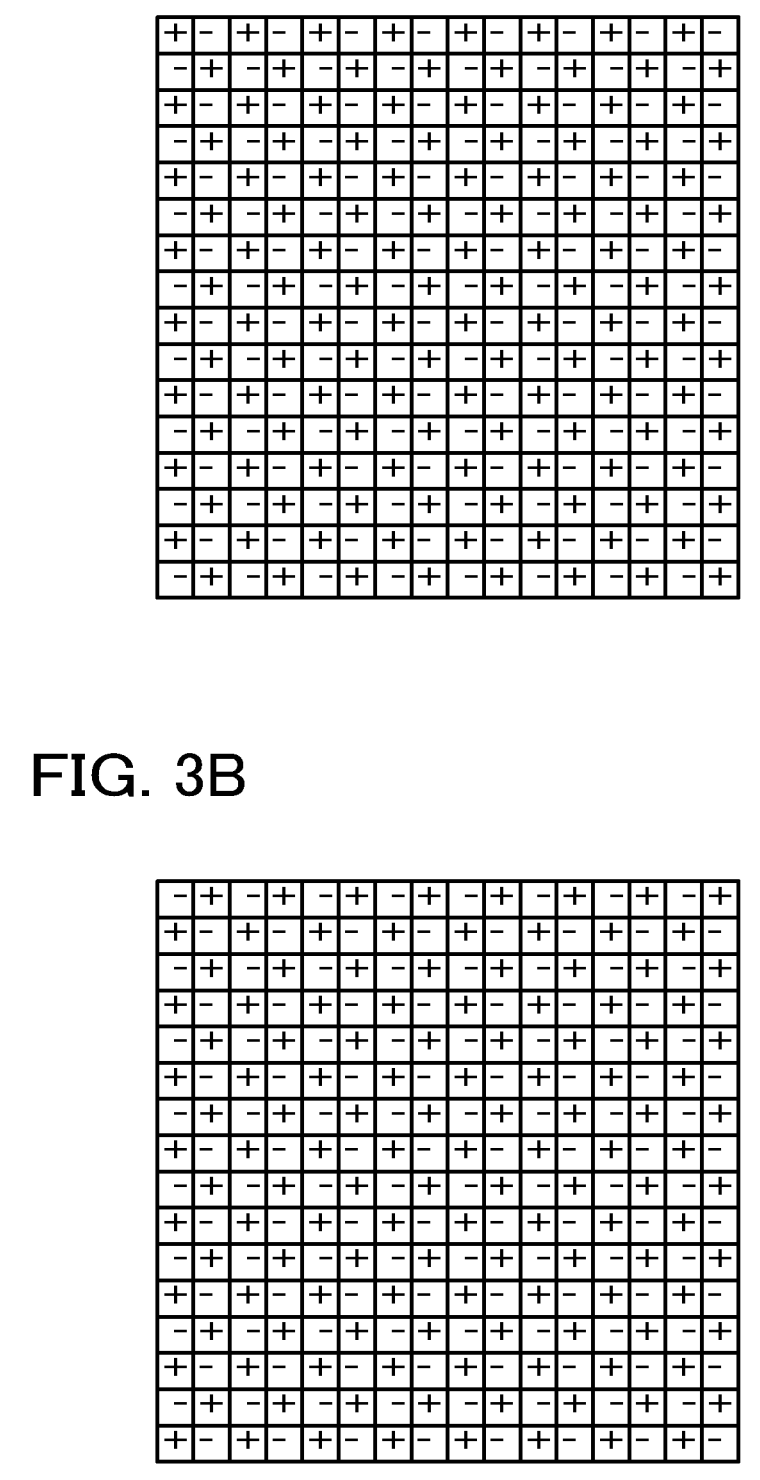

FIGS. 3A and 3B schematically show polarities of image signals supplied to pixels in the case of dot inversion driving. In FIG. 3A, "+" indicates a pixel to which an image signal having a positive polarity is supplied in one given frame period, and "−" indicates a pixel to which an image signal having a negative polarity is supplied in the given frame period. In FIG. 3B, "+" indicates a pixel to which an image signal having a positive polarity is supplied in a frame period next to the frame period of FIG. 3A, and "−" indicates a pixel to which an image signal having a negative polarity is supplied in the frame period next to the frame period of FIG. 3A.

In the dot inversion driving, as illustrated in FIGS. 3A and 3B, the polarity of image signals supplied to a plurality of pixels connected to one signal line is opposite to the polarity of image signals supplied to a plurality of pixels located adjacent to the plurality of pixels and connected to a signal line adjacent to the signal line. In addition, in a plurality of pixels connected to one signal line, the polarity of an image signal supplied to a pixel is opposite to the polarity of an image signal supplied to a pixel adjacent to the pixel. That is, when focusing on one frame period, the polarity of an image signal input to one signal line is inverted alternately.

Figure 4:
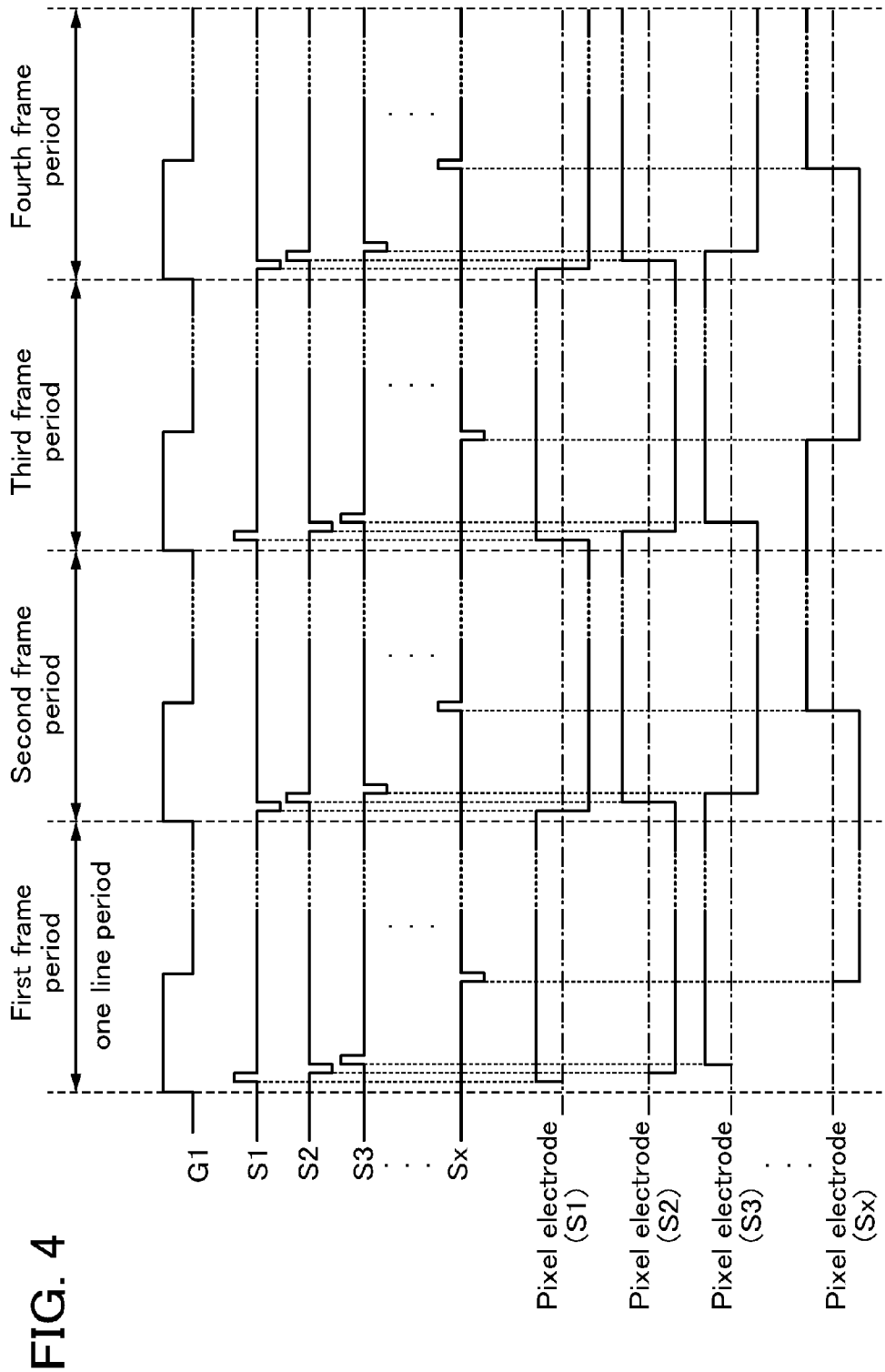
FIG. 4 is a timing chart in the case of operating a pixel portion by source line inversion driving.

FIG. 4 is a timing chart in the case of operating the pixel portion 101 illustrated in FIG. 1A by source line inversion driving. Specifically, FIG. 4 shows changes over time of the potential of a signal supplied to the scan line G1, the potentials of image signals supplied to the signal lines S1 to Sx, and the potentials of the pixel electrodes included in pixels connected to the scan line G1.

First, the scan line G1 is selected by inputting a signal with a pulse to the scan line G1. In each of the plurality of pixels 100 connected to the selected scan line G1, the transistor 102 is turned on. When a potential of an image signal is supplied to the signal lines S1 to Sx in the state where the transistor 102 is on, the potential of the image signal is supplied to the pixel electrode of the liquid crystal element 103 via the on-state transistor 102.

In the timing chart of FIG. 4, an example is shown in which, in a period during which the scan line G1 is selected in the first frame period, image signals having a positive polarity are sequentially input to the odd-numbered signal lines S1, S3, . . . and image signals having a negative polarity are input to the even-numbered signal lines S2, S4, . . . Sx. Therefore, image signals having a positive polarity are supplied to the pixel electrodes (S1), (S3), . . . (Sx−1) in the pixels 100 which are connected to the odd-numbered signal lines S1, S3, . . . Sx−1. Further, image signals having a negative polarity are supplied to the pixel electrodes (S2), (S4), . . . (Sx) in the pixels 100 connected to the even-numbered signal lines S2, S4, . . . Sx.

In the liquid crystal element 103, the orientation of liquid crystal molecules is changed in accordance with the level of the voltage applied between the pixel electrode and the counter electrode, whereby transmittance is changed. Accordingly, the transmittance of the liquid crystal element 103 can be controlled by the potential of the image signal; thus, a gray scale can be displayed.

When input of image signals to the signal lines S1 to Sx is completed, the selection of the scan line G1 is terminated. When the selection of the scan line is terminated, the transistors 102 are turned off in the pixels 100 connected to the scan line. Then, voltage applied between the pixel electrode and the counter electrode is held in the liquid crystal element 103, whereby display of a gray scale is maintained. Further, the scan lines G2 to Gy are sequentially selected, and operations similar to that in the period during which the scan line G1 is selected are performed in the pixels connected to the above respective scan lines.

Next, the scan line G1 is selected again in the second frame period. In a period during which the scan line G1 is selected in the second frame period, image signals having a negative polarity are sequentially input to the odd-numbered signal lines S1, S3, . . . Sx−1 and image signals having a positive polarity are input to the even-numbered signal lines S2, S4, . . . Sx, unlike the period during which the scan line G1 is selected in the first frame period. Therefore, image signals having a negative polarity are supplied to the pixel electrodes (S1), (S3), . . . (Sx−1) in the pixels 100 which are connected to the odd-numbered signal lines S1, S3, . . . Sx−1. Further, image signals having a positive polarity are supplied to the pixel electrodes (S2), (S4), . . . (Sx) in the pixels 100 connected to the even-numbered signal lines S2, S4, . . . Sx.

Also in the second frame period, when input of image signals to the signal lines S1 to Sx is finished, the selection of the scan line G1 is terminated. Further, the scan lines G2 to Gy are sequentially selected, and operations similar to that in the period during which the scan line G1 is selected are performed in the pixels connected to the above respective scan lines.

An operation similar to the above is repeated in the third frame period and the fourth frame period.

Although an example in which image signals are sequentially input to the signal lines S1 to Sx is shown in the timing chart of FIG. 4, the present invention is not limited to this structure. Image signals may be input to the signal lines S1 to Sx all at once, or image signals may be sequentially input per plural signal lines.

In this embodiment, the scan line is selected by progressive scan; however, interlace scan may also be employed for selecting a scan line.

By inversion driving in which the polarity of the potential of an image signal is inverted using a potential of a counter electrode as a reference potential, deterioration of a liquid crystal called burn-in can be prevented. However, in the inversion driving, the change in the potential supplied to the signal line is increased at the time of changing the polarity of the image signal; thus, a potential difference between a source electrode and a drain electrode of the transistor 102 which functions as a switching element is increased. Accordingly, in the transistor 102, a deterioration of characteristics such as a shift of threshold voltage is easily caused. Furthermore, in order to maintain the voltage held in the liquid crystal element 103, the off-state current of the transistor 102 needs to be low even when the potential difference between the source electrode and the drain electrode is large. In an embodiment of the present invention, a semiconductor whose band gap is larger than that of silicon or germanium and whose intrinsic carrier density is lower than that of silicon or germanium, such as an oxide semiconductor, is used for the transistor 102; therefore, the resistance of the transistor 102 to a high voltage can be increased and the off-state current can be made considerably low. Therefore, as compared to the case of using a transistor including a normal semiconductor material such as silicon or germanium, deterioration of the transistor 102 can be prevented and the voltage held in the liquid crystal element 103 can be maintained.

Note that the response time of a liquid crystal from application of voltage to saturation of the change in transmittance is generally about ten milliseconds, so that slow response of a liquid crystal tends to be recognized as a blur of a moving image. As a countermeasure, in an embodiment of the present invention, overdriving may be employed in which the voltage applied to the liquid crystal element 103 is temporarily increased so that the orientation of a liquid crystal changes quickly. By overdriving, response speed of a liquid crystal can be increased, a blur of a moving image can be prevented, and the quality of a moving image can be improved.

Further, if the transmittance of the liquid crystal element keeps changing without reaching a constant value after the transistor 102 is turned off, the relative permittivity of the liquid crystal also changes; accordingly, the voltage held in the liquid crystal element easily changes. In particular, as in an embodiment of the present invention, in the case where a capacitor is not connected in parallel to the liquid crystal element or in the case where a capacitor connected in parallel to the liquid crystal element has a small capacitance value, the above-described change in the voltage held in the liquid crystal element readily occurs remarkably. However, by the overdriving, the response time can be shortened and therefore the change in the transmittance of the liquid crystal element after the transistor 102 is turned off can be made small. Accordingly, even in the case where a capacitor is not connected in parallel to the liquid crystal element or even in the case where a capacitor connected in parallel to the liquid crystal element has a small capacitance value, the change in the voltage held in the liquid crystal element after turning off the transistor 102 can be prevented.

Figure 5A:
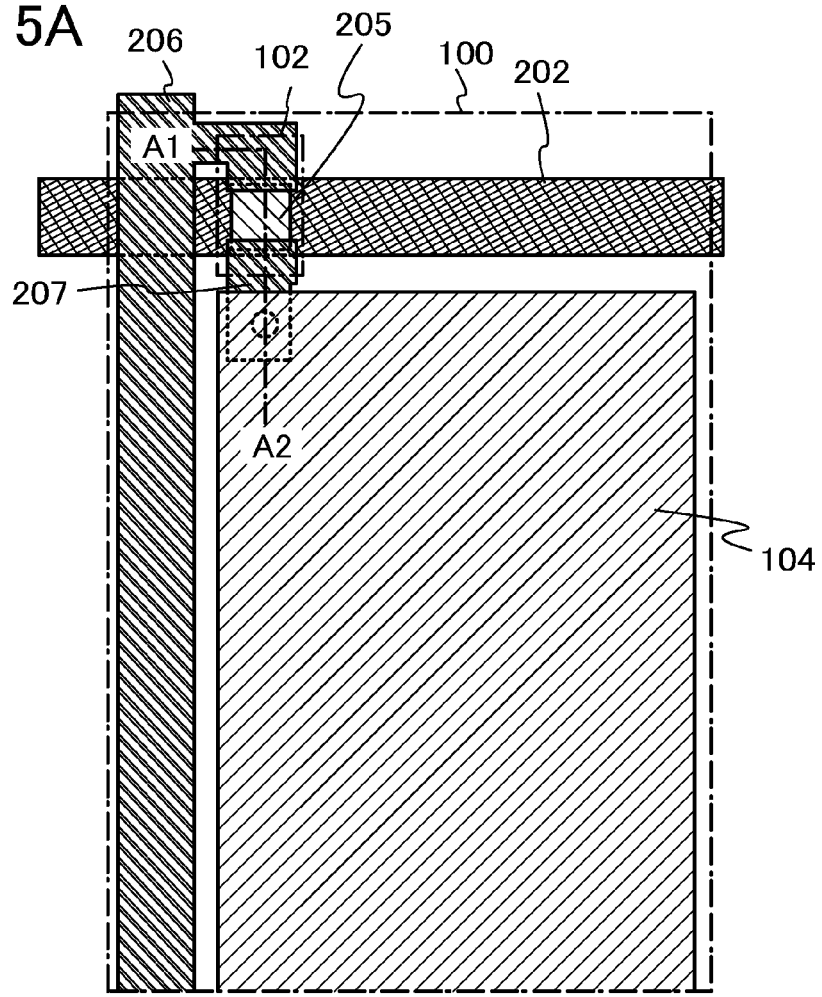
FIGS. 5A and 5B are a top view and a cross-sectional view of a pixel.
Figure 5B:
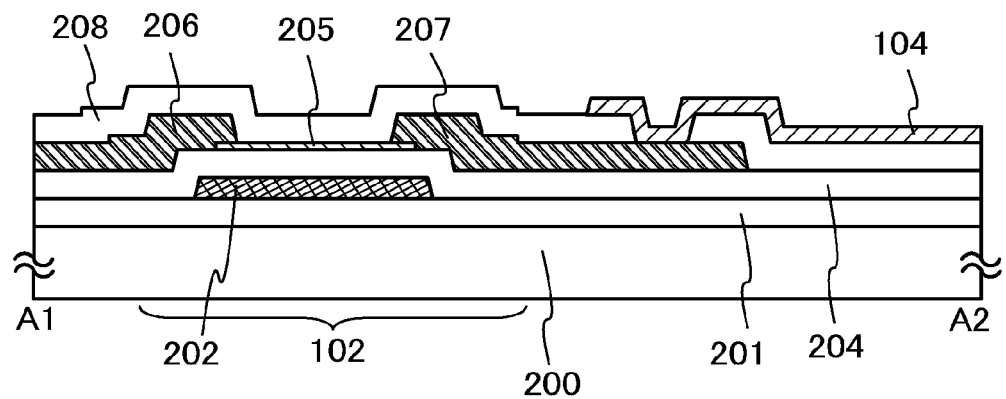

Next, a specific structure of a pixel in an embodiment of the present invention will be described. FIG. 5A is an example of a top view of a pixel in an embodiment of the present invention. FIG. 5B is a cross-sectional view taken along a broken line A1-A2 of FIG. 5A.

In the pixel 100 illustrated in FIG. 5A, an insulating film 201 is formed over a substrate 200 and a conductive film 202 is formed over the insulating film 201. The conductive film 202 functions as a scan line and a gate electrode of the transistor 102. Further, a gate insulating film 204 is formed over the conductive film 202, and a semiconductor film 205 is formed over the gate insulating film 204 in a position overlapping with the conductive film 202. The semiconductor film 205 includes a semiconductor such as an oxide semiconductor whose band gap is wider than that of a silicon semiconductor and whose intrinsic carrier density is lower than that of silicon, and functions as an active layer of the transistor 102.

A conductive film 206 and a conductive film 207 are formed over the semiconductor film 205. The conductive film 206 and the conductive film 207 can be formed by processing a conductive film formed over the gate insulating film 204 and the semiconductor film 205 into a desired shape by etching or the like. The conductive film 206 functions as a signal line and a first terminal of the transistor 102. The conductive film 207 functions as a second terminal of the transistor 102.

An insulating film 208 is formed over the semiconductor film 205, the conductive film 206, and the conductive film 207. The pixel electrode 104 of the liquid crystal element 103 is formed over the insulating film 208. The pixel electrode 104 is connected to the conductive film 207 through a contact hole formed in the insulating film 208.

As illustrated in FIG. 5A, in an embodiment of the present invention, a capacitor is not connected in parallel to the liquid crystal element. In other words, the conductive film 207 is electrically connected only to the pixel electrode 104 and the semiconductor film 205. As a result, the aperture ratio of the pixel 100 can be increased significantly.

Although the transistor 102 illustrated in FIG. 5A is of an inverted staggered type, the transistor 102 may have another structure such as a bottom contact type or a top gate type.

For the pixel electrode 104, a light-transmitting conductive film is used. The light-transmitting conductive film is formed using indium oxide, a mixed oxide of indium oxide and tin oxide (abbreviated as ITO), or the like by a sputtering method, a vacuum evaporation method, or the like. As another material of the light-transmitting conductive film, an Al—Zn—O-based oxide semiconductor containing nitrogen, a Zn—O-based oxide semiconductor containing nitrogen, or a Sn—Zn—O-based oxide semiconductor containing nitrogen may be used.

Note that a plurality of pixels 100 is positioned in the pixel portion in practice. The plurality of pixels 100 may be arranged in the pixel portion in a stripe arrangement, a delta arrangement, or a Bayer arrangement.

Colors used in color display is not limited to three colors of RGB (R for red, G for green, and B for blue) and may be more colors. For example, for color display, RGBW (W for white) may be used, or one or more of yellow, cyan, magenta, or the like may be used in addition to RGB.

Figure 17A:
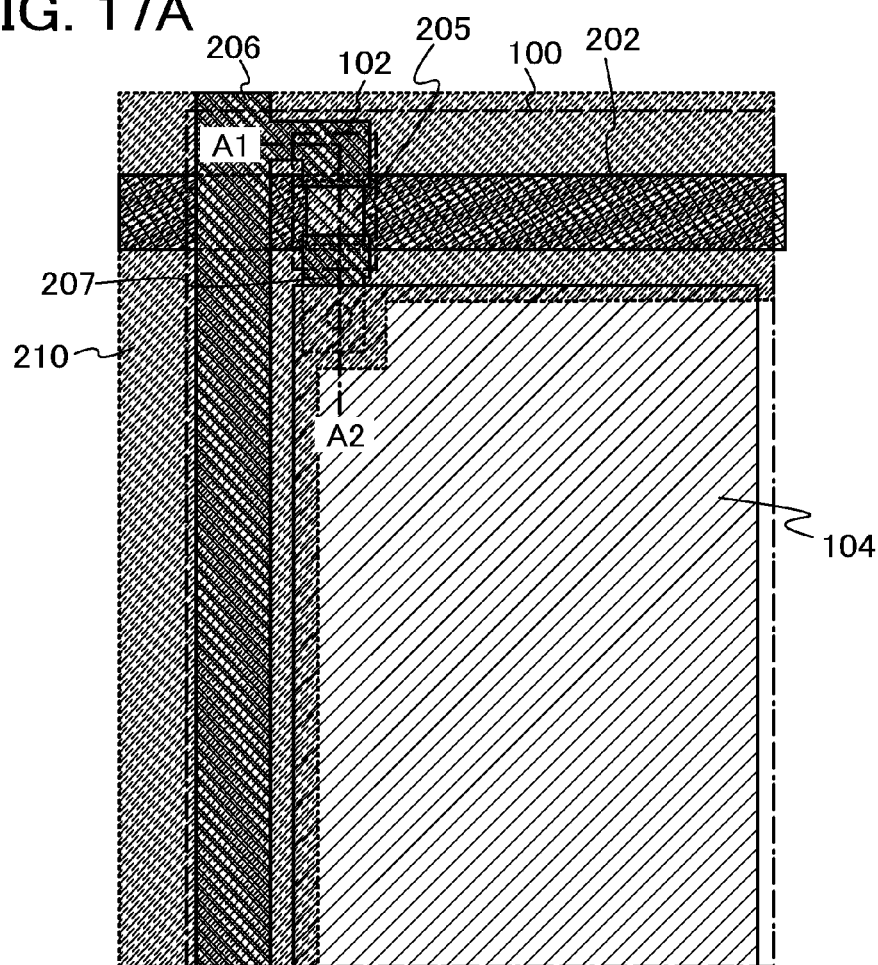
FIGS. 17A and 17B are a top view and a cross-sectional view of a pixel.
Figure 17B:
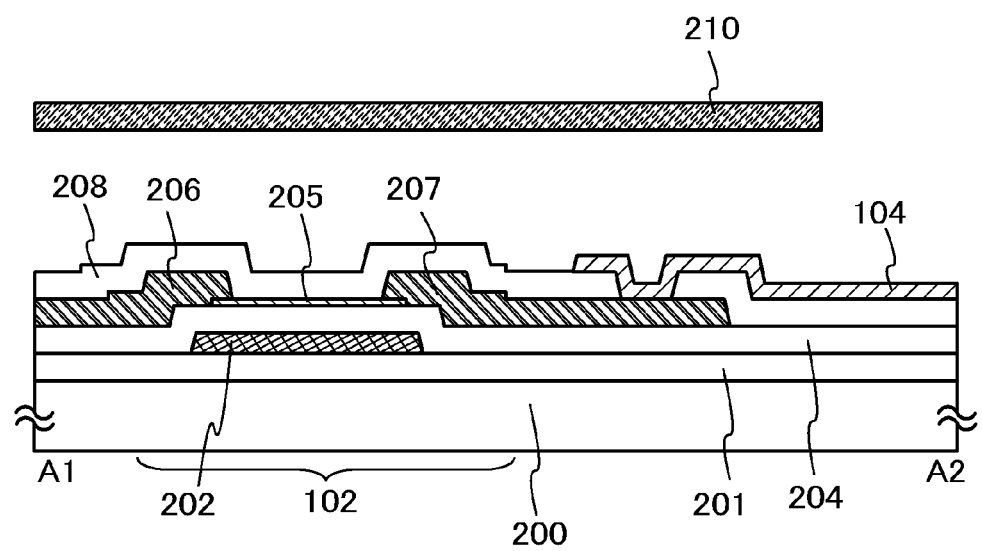

The pixel illustrated in FIGS. 5A and 5B may be provided with a blocking film capable of blocking light. FIG. 17A is an example of a top view of a case where a blocking film 210 overlaps with the pixel 100 illustrated in FIGS. 5A and 5B. FIG. 17B is a cross-sectional view taken along a broken line A1-A2 of FIG. 17A. As illustrated in FIGS. 17A and 17B, the blocking film 210 has an opening portion in a region overlapping with the pixel electrode 104. Thus, by the existence of the blocking film 210, the semiconductor film 205 is shielded from light; accordingly, photodegradation of the oxide semiconductor included in the semiconductor film 205 can be prevented and a deterioration in characteristics such as a shift of the threshold voltage of the transistor 102 can be prevented. Further, by providing the blocking film 210 between pixels, disclination caused by disorder of the orientation of the liquid crystal between pixels can be prevented.

When the semiconductor film 205 is formed in a position so that whole of the semiconductor film 205 completely overlaps with the conductive film 202 functioning as a gate electrode as illustrated in FIGS. 17A and 17B, light from the substrate 200 side can be prevented from entering the semiconductor film 205. Therefore, photodegradation of the oxide semiconductor included in the semiconductor film 205 can be prevented and a deterioration in characteristics such as a shift of the threshold voltage of the transistor 102 can be prevented.

Note that in the case of forming a driving circuit on a panel, also by disposing a gate electrode or a blocking film so as to block light for a transistor used in the driver circuit, a deterioration in characteristics such as a shift of the threshold voltage of the transistor can be prevented.

Next, the increase in aperture ratio of each pixel in a liquid crystal display device by using a transistor including an oxide semiconductor film of an embodiment of the present invention is estimated.

Parameters for estimating the aperture ratio of a pixel are assumed as follows: the off-state current of the transistor including the oxide semiconductor film is 1 yA, the diagonal of the pixel portion is 3.4 inches, the grayscale to be expressed is 256 gray levels, the voltage input is 10 V, and one frame period is $1.66 \times 10^{-2}$ sec. Moreover, a gate insulating film is assumed to have a relative permittivity of 3.7 and a thickness of 100 nm.

First, the area of a capacitor and the aperture ratio in the case where the above-described parameters are applied to a panel (referred to as a first panel) in which the number of pixels is 540×RGB×960 are estimated. The pixel size in the panel is 26 μm×78 μm, that is, $2.03 \times 10^{-9}$ m². The area except for a region occupied by a wiring and a transistor is $1.43 \times 10^{-9}$ m², and the area of the region occupied by the wiring and the transistor is $6.00 \times 10^{-10}$ m².

In the first panel that includes a pixel having a capacitor and a transistor including an oxide semiconductor film, a minimum necessary capacitance of the capacitor is $4.25 \times 10^{-25}$ F. In this case, the area necessary for the capacitor is $1.30 \times 10^{-21}$ m², the capacitor accounts for $6.4 \times 10^{-11}\%$ of the area of the pixel, and the aperture ratio is 70.4%.

Further, the area of a capacitor and the aperture ratio in the case where the above-described parameters are applied to a panel (referred to as a second panel) in which the number of pixels is 480×RGB×640 are estimated. The pixel size in the panel is 36 μm×108 μm, that is, the area of the pixel is $3.89 \times 10^{-9}$ m². The area except for a region occupied by a wiring and a transistor is $3.29 \times 10^{-9}$ m², and the area of the region occupied by the wiring and the transistor is $6.00 \times 10^{-10}$ m².

In the second panel that includes a pixel having a capacitor and a transistor including an oxide semiconductor film, a minimum necessary capacitance of the capacitor is $4.25 \times 10^{-25}$ F. In this case, the area necessary for the capacitor is $1.30 \times 10^{-21}$ m², the capacitor accounts for $3.3 \times 10^{-11}\%$ of the area of the pixel, and the aperture ratio is 84.6%.

As described above, by using transistors having low off-state current of an embodiment of the present invention for the first panel and the second panel, the area of a capacitor having a minimum capacitance can be reduced to as small as a substantially negligible size. Thus, it is found that high aperture ratios of 70.4% in the first panel and 84.6% in the second panel can be obtained.

Embodiment 2

In this embodiment, a manufacturing method of a transistor including an oxide semiconductor will be described.

Figure 6A:
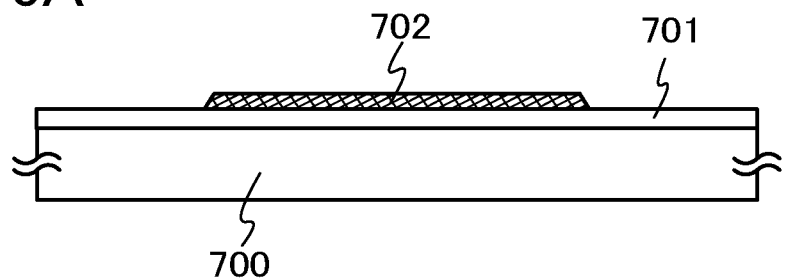
FIGS. 6A to 6C are cross-sectional views illustrating a manufacturing method of a transistor.

First, as illustrated in FIG. 6A, an insulating film 701 is formed over an insulating surface of a substrate 700, and a gate electrode 702 is formed over the insulating film 701.

Although there is no particular limitation on a substrate which can be used as the substrate 700 as long as it has a light-transmitting property, it is necessary that the substrate have at least enough heat resistance to heat treatment performed later. For example, a glass substrate manufactured by a fusion process or a float process, a quartz substrate, a ceramic substrate, or the like can be used as the substrate 700. When the temperature of the heat treatment performed later is high, a substrate having a strain point of 730° C. or higher is preferably used as the glass substrate. Although a substrate formed of a flexible synthetic resin such as plastic generally has a lower resistance temperature than the aforementioned substrates, it may be used as long as being resistant to a processing temperature during a manufacturing process.

The insulating film 701 is formed using a material which can withstand a temperature of heat treatment in a later manufacturing step. Specifically, it is preferable to use silicon oxide, silicon nitride, silicon nitride oxide, silicon oxynitride, aluminum nitride, aluminum oxide, or the like for the insulating film 701.

In this specification, an oxynitride refers to a substance in which the amount of oxygen is larger than that of nitrogen, and a nitride oxide refers to a substance in which the amount of nitrogen is larger than that of oxygen.

The gate electrode 702 can be formed with a single layer or a stacked layer using one or more of conductive films including a metal material such as molybdenum, titanium, chromium, tantalum, tungsten, neodymium, or scandium, or an alloy material which includes any of these metal materials as a main component, or a nitride of these metals. Note that aluminum or copper can also be used as such a metal material if it can withstand the temperature of heat treatment to be performed in a later process. Aluminum or copper is preferably combined with a refractory metal material in order to prevent a heat resistance problem and a corrosive problem. As the refractory metal material, molybdenum, titanium, chromium, tantalum, tungsten, neodymium, scandium, or the like can be used.

For example, as a two-layer structure of the gate electrode 702, the following structures are preferable: a two-layer structure in which a molybdenum film is stacked over an aluminum film, a two-layer structure in which a molybdenum film is stacked over a copper film, a two-layer structure in which a titanium nitride film or a tantalum nitride film is stacked over a copper film, and a two-layer structure in which a titanium nitride film and a molybdenum film are stacked. As a three-layer structure of the gate electrode 702, the following structure is preferable: a stacked structure in which an aluminum film, an alloy film of aluminum and silicon, an alloy film of aluminum and titanium, or an alloy film of aluminum and neodymium is used as a middle layer and sandwiched between two films of an upper layer and a lower layer which are selected from a tungsten film, a tungsten nitride film, a titanium nitride film, or a titanium film.

Further, a light-transmitting oxide conductive film of indium oxide, a mixed oxide of indium oxide and tin oxide, a mixed oxide of indium oxide and zinc oxide, zinc oxide, zinc aluminum oxide, zinc aluminum oxynitride, zinc gallium oxide, or the like can be used as the gate electrode 702.

The thickness of the gate electrode 702 is in the range of 10 nm to 400 nm, preferably 100 nm to 200 nm. In this embodiment, after a conductive film for the gate electrode is formed to have a thickness of 150 nm by sputtering using a tungsten target, the conductive film is processed (patterned) into a desired shape by etching, whereby the gate electrode 702 is formed. Note that when end portions of the formed gate electrode have a tapered shape, coverage with a gate insulating film stacked thereover is improved, which is preferable. Note that a resist mask may be formed by an inkjet method. Formation of the resist mask by an inkjet method needs no photomask; thus, manufacturing cost can be reduced.

Figure 6B:
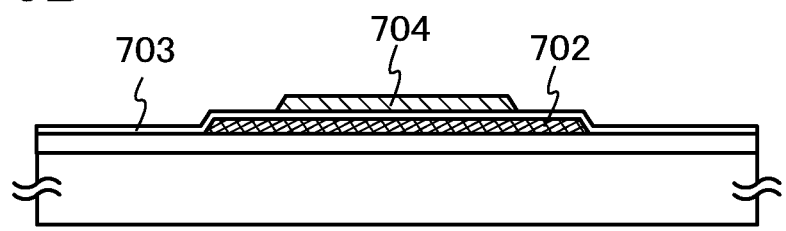

Next, as illustrated in FIG. 6B, a gate insulating film 703 is formed over the gate electrode 702, and an island-shaped oxide semiconductor film 704 is formed over the gate insulating film 703 in a position overlapping with the gate electrode 702.

The gate insulating film 703 can be formed with a single-layer structure or a stacked structure including any of a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, or a tantalum oxide film by a plasma CVD method, a sputtering method, or the like. It is preferable that the gate insulating film 703 include impurities such as moisture, hydrogen, or oxygen as little as possible. In the case of forming a silicon oxide film by sputtering, a silicon target or a quartz target is used as a target, and oxygen or a mixed gas of oxygen and argon is used as a sputtering gas.

The oxide semiconductor which becomes i-type or becomes substantially i-type (an oxide semiconductor which is purified) by removal of an impurity is extremely sensitive to an interface state density or an interface electric charge; therefore, the interface between the purified oxide semiconductor and the gate insulating film 703 is important. Therefore, the gate insulating film (GI) that is in contact with the purified oxide semiconductor needs to have higher quality.

For example, a high-density plasma CVD using a microwave (frequency: 2.45 GHz) is preferably used, in which case a dense insulating film having high withstand voltage and high quality can be formed. This is because when the purified oxide semiconductor is in contact with the high-quality gate insulating film, the interface state density can be reduced and favorable interface characteristics can be obtained.

Needless to say, other film formation methods, such as a sputtering method or a plasma CVD method, can be applied as long as a high-quality insulating film can be formed as the gate insulating film 703. Moreover, it is possible to use an insulating film whose quality and characteristics of the interface with the oxide semiconductor are improved through heat treatment performed after the formation of the insulating film. In any case, an insulating film that has favorable film quality as the gate insulating film and can reduce interface state density between the gate insulating film and the oxide semiconductor to form a favorable interface is formed.

The gate insulating film 703 may be formed to have a structure in which an insulating film including a material having a high barrier property and an insulating film having lower proportion of nitrogen, such as a silicon oxide film or a silicon oxynitride film, are stacked. In this case, the insulating film such as a silicon oxide film or a silicon oxynitride film is formed between the insulating film having a high barrier property and the oxide semiconductor film. As the insulating film having a high barrier property, a silicon nitride film, a silicon nitride oxide film, an aluminum nitride film, an aluminum nitride oxide film, or the like can be given, for example. The insulating film having a high barrier property can prevent impurities in an atmosphere, such as moisture or hydrogen, or impurities in the substrate, such as an alkali metal or a heavy metal, from entering the oxide semiconductor film, the gate insulating film 703, or the interface between the oxide semiconductor film and another insulating film and the vicinity thereof. In addition, the insulating film having lower proportion of nitrogen, such as a silicon oxide film or a silicon oxynitride film, in contact with the oxide semiconductor film can prevent the insulating film having a high barrier property from being in direct contact with the oxide semiconductor film.

For example, the gate insulating film 703 may be formed in the following manner: a silicon nitride film ($SiN_y$ ($y>0$)) with a thickness of greater than or equal to 50 nm and less than or equal to 200 nm is formed by a sputtering method as a first gate insulating film, and a silicon oxide film ($SiO_x$ ($x>0$)) with a thickness of greater than or equal to 5 nm and less than or equal to 300 nm is stacked over the first gate insulating film as a second gate insulating film. The thickness of the gate insulating film 703 may be set as appropriate depending on characteristics needed for the transistor and may be about 350 nm to 400 nm.

In this embodiment, the gate insulating film 703 having a structure in which a silicon oxide film having a thickness of 100 nm formed by a sputtering method is stacked over a silicon nitride film having a thickness of 50 nm formed by a sputtering method is formed.

Note that the gate insulating film 703 is in contact with the oxide semiconductor to be formed later. When hydrogen is contained in the oxide semiconductor, characteristics of the transistor are adversely affected; therefore, it is preferable that the gate insulating film 703 do not contain hydrogen, a hydroxyl group, and moisture. In order that the gate insulating film 703 contains as little hydrogen, a hydroxyl group, and moisture as possible, it is preferable that an impurity adsorbed on the substrate 700, such as moisture or hydrogen, be eliminated and removed by preheating the substrate 700, over which the gate electrode 702 is formed, in a preheating chamber of a sputtering apparatus, as a pretreatment for film formation. The temperature for the preheating is higher than or equal to 100° C. and lower than or equal to 400° C., preferably higher than or equal to 150° C. and lower than or equal to 300° C. As an exhaustion unit provided in the preheating chamber, a cryopump is preferable. Note that this preheating treatment can be omitted.

The island-shaped oxide semiconductor film 704 can be formed by processing an oxide semiconductor film formed over the gate insulating film 703 into a desired shape. The thickness of the oxide semiconductor film is greater than or equal to 2 nm and less than or equal to 200 nm, preferably greater than or equal to 3 nm and less than or equal to 50 nm, further preferably greater than or equal to 3 nm and less than or equal to 20 nm. The oxide semiconductor film is formed by a sputtering method using an oxide semiconductor target. Moreover, the oxide semiconductor film can be formed by a sputtering method under a rare gas (e.g., argon) atmosphere, an oxygen atmosphere, or a mixed atmosphere of a rare gas (e.g., argon) and oxygen.

Note that before the oxide semiconductor film is formed by a sputtering method, dust on a surface of the gate insulating film 703 is preferably removed by reverse sputtering in which an argon gas is introduced and plasma is generated. The reverse sputtering refers to a method in which, without application of voltage to a target side, an RF power source is used for application of voltage to a substrate side in an argon atmosphere to generate plasma in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Alternatively, an argon atmosphere to which chlorine, carbon tetrafluoride, or the like is added may be used.

As described above, as the oxide semiconductor film, the following oxide semiconductors can be used: a quaternary metal oxide such as an In—Sn—Ga—Zn—O-based oxide semiconductor; a ternary metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor; a binary metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, an In—Ga—O-based oxide semiconductor; an In—O-based oxide semiconductor; a Sn—O-based oxide semiconductor; and a Zn—O-based oxide semiconductor.

In this embodiment, as the oxide semiconductor film, an In—Ga—Zn—O-based oxide semiconductor thin film with a thickness of 30 nm, which is obtained by a sputtering method using a target including indium (In), gallium (Ga), and zinc (Zn), is used. As the above-described target, a target having a composition ratio of $In_2O_3:Ga_2O_3:ZnO=1:1:1$ [molar ratio] is used. Alternatively, a target having a composition ratio of $In_2O_3:Ga_2O_3:ZnO=1:1:2$ [molar ratio] or a target having a composition ratio of $In_2O_3:Ga_2O_3:ZnO=1:1:4$ [molar ratio] can be used. The filling rate of the target including In, Ga, and Zn is greater than or equal to 90% and less than or equal to 100%, preferably greater than or equal to 95% and less than or equal to 100%. With the use of the target having high filling rate, a dense oxide semiconductor film is formed.

In this embodiment, the oxide semiconductor film is formed over the substrate 700 in such a manner that the substrate is held in a treatment chamber kept at reduced pressure, a sputtering gas from which hydrogen and moisture are removed is introduced into the treatment chamber while residual moisture therein is removed, and the above target is used. The substrate temperature in film formation may be higher than or equal to 100° C. and lower than or equal to 600° C., preferably higher than or equal to 200° C. and lower than or equal to 400° C. By forming the oxide semiconductor film in a state where the substrate is heated, the concentration of impurities included in the formed oxide semiconductor film can be reduced. In addition, damage by sputtering can be reduced. In order to remove residual moisture in the treatment chamber, an entrapment vacuum pump is preferably used. For example, a cryopump, an ion pump, or a titanium sublimation pump is preferably used. The exhaustion unit may be a turbo pump provided with a cold trap. In the film formation chamber which is exhausted with the cryopump, for example, a hydrogen atom, a compound containing a hydrogen atom, such as water ($H_2O$), (preferably, also a compound containing a carbon atom), and the like are removed, whereby the concentration of an impurity contained in the oxide semiconductor film formed in the film formation chamber can be reduced.

As one example of the film formation condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulsed direct-current (DC) power source is preferable because dust generated in film formation can be reduced and the film thickness can be made uniform.

In order that the oxide semiconductor film contains as little hydrogen, a hydroxyl group, and moisture as possible, it is preferable that an impurity adsorbed on the substrate 700, such as moisture or hydrogen, be eliminated and removed by preheating the substrate 700, over which films up to the gate insulating film 703 are formed, in a preheating chamber of a sputtering apparatus, as a pretreatment for film formation. The temperature for the preheating is higher than or equal to 100° C. and lower than or equal to 400° C., preferably higher than or equal to 150° C. and lower than or equal to 300° C. As an exhaustion unit provided in the preheating chamber, a cryopump is preferable. Note that this preheating treatment can also be omitted. This preheating may be similarly performed on the substrate 700 over which films up to and including the conductive film 705 and the conductive film 706 are formed, before the formation of an insulating film 707 which will be formed later.

Note that etching for forming the island-shaped oxide semiconductor film 704 may be wet etching, dry etching, or both dry etching and wet etching. As the etching gas for dry etching, a gas containing chlorine (chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate RIE (reactive ion etching) method or an ICP (inductively coupled plasma) etching method can be used. In order to etch the film into a desired shape, the etching condition (electric energy applied to a coil-shaped electrode, electric energy applied to an electrode on a substrate side, the temperature of the electrode on the substrate side, or the like) is adjusted as appropriate.

As an etchant used for wet etching, ITO-07N (produced by KANTO CHEMICAL CO., INC.) may be used.

A resist mask for forming the island-shaped oxide semiconductor film 704 may be formed by an inkjet method. Formation of the resist mask by an inkjet method needs no photomask; thus, manufacturing cost can be reduced.

Note that it is preferable that reverse sputtering be performed before the formation of a conductive film in a subsequent step so that a resist residue or the like left over surfaces of the island-shaped oxide semiconductor film 704 and the gate insulating film 703 is removed.

Note that, in some cases, the oxide semiconductor film formed by sputtering or the like includes a large amount of moisture or hydrogen as impurities. Moisture and hydrogen easily form a donor level and thus serve as impurities in the oxide semiconductor. Thus, in an embodiment of the present invention, in order to reduce an impurity such as moisture or hydrogen in the oxide semiconductor film, heat treatment is performed on the island-shaped oxide semiconductor film 704 under a nitrogen atmosphere, an oxygen atmosphere, an atmosphere of ultra-dry air, or a rare gas (e.g., argon, helium) atmosphere. It is preferable that the water content in the gas be 20 ppm or less, preferably 1 ppm or less, or further preferably 10 ppb or less.

By performing heat treatment on the island-shaped oxide semiconductor film 704, moisture or hydrogen in the island-shaped oxide semiconductor film 704 can be eliminated. Specifically, heat treatment may be performed at a temperature higher than or equal to 300° C. and lower than or equal to 700° C., preferably higher than or equal to 300° C. and lower than or equal to 500° C. For example, heat treatment may be performed at 500° C. for 3 to 6 minutes. When an RTA method is used for the heat treatment, dehydration or dehydrogenation can be performed in a short time; therefore, treatment can be performed even at a temperature higher than the strain point of a glass substrate.

In this embodiment, an electrical furnace that is one of heat treatment apparatuses is used.

Note that a heat treatment apparatus is not limited to an electrical furnace, and may include a device for heating a process object by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating a process object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the gas, an inert gas which does not react with a process object by heat treatment, such as nitrogen or a rare gas such as argon, is used.

Note that it is preferable that in the heat treatment, moisture, hydrogen, or the like be not contained in nitrogen or a rare gas such as helium, neon, or argon. It is preferable that the purity of nitrogen or the rare gas such as helium, neon, or argon which is introduced into a heat treatment apparatus be set to be 6N (99.9999%) or higher, preferably 7N (99.99999%) or higher (that is, the impurity concentration is 1 ppm or less, preferably 0.1 ppm or less).

Through the above-described process, the concentration of hydrogen in the island-shaped oxide semiconductor film 704 can be reduced and the island-shaped oxide semiconductor film 704 can be purified. Thus, the characteristics of the oxide semiconductor film can be stabilized. In addition, heat treatment at a temperature of lower than or equal to the glass transition temperature makes it possible to form an oxide semiconductor film whose band gap is wide and whose carrier density is extremely low. Therefore, the transistor can be manufactured using a large-sized substrate, so that the productivity can be increased. In addition, by using the purified oxide semiconductor film in which the hydrogen concentration is reduced, it is possible to manufacture a transistor with high withstand voltage and an extremely low off-state current.

Note that in the case where the oxide semiconductor film is heated, although depending on a material of the oxide semiconductor film or heating conditions, plate-like crystals are formed at the surface of the oxide semiconductor film in some cases. The plate-like crystal is preferably a single crystal which is c-axis-aligned in a direction substantially perpendicular to a surface of the oxide semiconductor film. Even if the plate-like crystals do not form a single crystal body, each crystal is preferably a polycrystalline body which is c-axis-aligned in a direction substantially perpendicular to the surface of the oxide semiconductor film. In the above-described polycrystalline body, in addition to being c-axis-aligned, the crystals preferably have identical a-b planes, a-axes, or b-axes. Note that when a base surface of the oxide semiconductor film is uneven, a plate-like crystal is a polycrystal. Therefore, the surface of the base is preferably as even as possible.

Figure 6C:
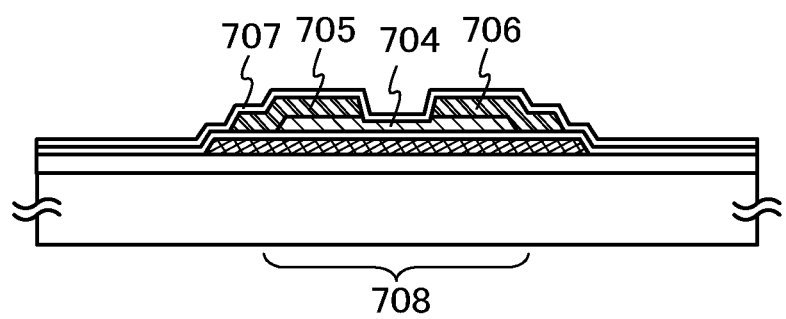

Next, as illustrated in FIG. 6C, the conductive film 705 and the conductive film 706 functioning as a source electrode and a drain electrode are formed, and an insulating film 707 is formed over the conductive film 705, the conductive film 706, and the island-shaped oxide semiconductor film 704.

The conductive film 705 and the conductive film 706 are formed in the following manner: a conductive film is formed to cover the island-shaped oxide semiconductor film 704 by a sputtering method or a vacuum evaporation method, and then the conductive film is patterned by etching or the like.

The conductive film 705 and the conductive film 706 are in contact with the island-shaped oxide semiconductor film 704. As a material of the conductive film for forming the conductive film 705 and the conductive film 706, any of the following materials can be used: an element selected from aluminum, chromium, copper, tantalum, titanium, molybdenum, or tungsten; an alloy including any of these elements; an alloy film including the above elements in combination; or the like. Alternatively, a structure may be employed in which a film of a refractory metal such as chromium, tantalum, titanium, molybdenum, or tungsten is stacked over or below a metal film of aluminum or copper. Aluminum or copper is preferably combined with a refractory metal material so as to prevent a heat resistance problem and a corrosion problem. As the refractory metal material, molybdenum, titanium, chromium, tantalum, tungsten, neodymium, scandium, yttrium, or the like can be used.

Further, the conductive film may have a single-layer structure or a stacked-layer structure of two or more layers. For example, a single-layer structure of an aluminum film containing silicon; a two-layer structure of an aluminum film and a titanium film stacked thereover; a three-layer structure in which a titanium film, an aluminum film, and a titanium film are stacked in this order; and the like can be given.

As the conductive film for forming the conductive film 705 and the conductive film 706, a conductive metal oxide may be used. As the conductive metal oxide, indium oxide, tin oxide, zinc oxide, a mixed oxide of indium oxide and tin oxide, a mixed oxide of indium oxide and zinc oxide, or the conductive metal oxide material containing silicon or silicon oxide can be used.

In the case where heat treatment is performed after formation of the conductive film, the conductive film preferably has heat resistance enough to withstand the heat treatment.

Note that the material and etching conditions are adjusted as appropriate so that the island-shaped oxide semiconductor film 704 is not removed in etching of the conductive film as much as possible. Depending on the etching conditions, there are some cases in which an exposed portion of the island-shaped oxide semiconductor film 704 is partly etched and thereby a groove (a depression portion) is formed.

In this embodiment, a titanium film is used as the conductive film. Therefore, wet etching can be selectively performed on the conductive film using a solution (ammonia hydrogen peroxide mixture) containing ammonia and hydrogen peroxide water; however, the island-shaped oxide semiconductor film 704 is partly etched in some cases. As the ammonia hydrogen peroxide mixture, specifically, a solution in which hydrogen peroxide water of 31 wt %, ammonia water of 28 wt %, and water are mixed at a volume ratio of 5:2:2 is used. Alternatively, dry etching may be performed on the conductive film with the use of a gas containing chlorine ($Cl_2$), boron trichloride ($BCl_3$), or the like.

In order to reduce the number of photomasks and steps in a photolithography step, etching may be performed with the use of a resist mask formed using a multi-tone mask which is a light-exposure mask through which light is transmitted so as to have a plurality of intensities. A resist mask formed with the use of a multi-tone mask has a plurality of thicknesses and further can be changed in shape by etching; therefore, the resist mask can be used in a plurality of etching steps for processing into different patterns. Therefore, a resist mask corresponding to at least two kinds of different patterns can be formed by one multi-tone mask. Thus, the number of light-exposure masks can be reduced and the number of corresponding photolithography steps can also be reduced, whereby simplification of the process can be realized.

Note that before formation of the insulating film 707, the island-shaped oxide semiconductor film 704 is subjected to plasma treatment with the use of a gas such as $N_2O$, $N_2$, or Ar. By the plasma treatment, adsorbed water or the like on an exposed surface of the island-shaped oxide semiconductor film 704 is removed. Plasma treatment may also be performed using a mixture gas of oxygen and argon.

The insulating film 707 preferably contains as little impurities such as moisture, hydrogen, and oxygen as possible. An insulating film of a single layer or a plurality of insulating films stacked may be employed for the insulating film 707. When hydrogen is contained in the insulating film 707, entry of the hydrogen to the oxide semiconductor film or extraction of oxygen from the oxide semiconductor film by the hydrogen occurs, whereby a back channel portion of the island-shaped oxide semiconductor film 704 has lower resistance (n-type conductivity); thus, a parasitic channel might be formed. Therefore, it is important that a film formation method in which hydrogen is not used be employed in order to form the insulating film 707 containing as little hydrogen as possible. A material having a high barrier property is preferably used for the insulating film 707. For example, as the insulating film having a high barrier property, a silicon nitride film, a silicon nitride oxide film, an aluminum nitride film, an aluminum nitride oxide film, or the like can be used. When a plurality of insulating films stacked is used, an insulating film having a lower proportion of nitrogen such as a silicon oxide film or a silicon oxynitride film is formed on the side closer to the island-shaped oxide semiconductor film 704 than the insulating film having a high barrier property. Then, the insulating film having a high barrier property is formed so as to overlap with the conductive film 705, the conductive film 706, and the island-shaped oxide semiconductor film 704 with the insulating film having a lower proportion of nitrogen between the insulating film having a high barrier property and the conductive film 705, the conductive film 706, and the island-shaped oxide semiconductor film 704. When the insulating film having a high barrier property is used, impurities such as moisture or hydrogen can be prevented from entering the island-shaped oxide semiconductor film 704, the gate insulating film 703, or the interface between the island-shaped oxide semiconductor film 704 and another insulating film and the vicinity thereof. In addition, the insulating film having a lower proportion of nitrogen such as a silicon oxide film or a silicon oxynitride film formed in contact with the island-shaped oxide semiconductor film 704 can prevent the insulating film formed using a material having a high barrier property from being in direct contact with the island-shaped oxide semiconductor film 704.

In this embodiment, the insulating film 707 having a structure in which a silicon nitride film having a thickness of 100 nm formed using a sputtering method is stacked over a silicon oxide film having a thickness of 200 nm formed using a sputtering method is formed. The substrate temperature in film formation may be higher than or equal to room temperature and lower than or equal to 300° C., and is 100° C. in this embodiment.

After the insulating film 707 is formed, heat treatment may be performed. The heat treatment is performed in a nitrogen atmosphere, an atmosphere of ultra-dry air, or a rare gas (e.g., argon, helium) atmosphere preferably at a temperature higher than or equal to 200° C. and lower than or equal to 400° C., for example, higher than or equal to 250° C. and lower than or equal to 350° C. It is desirable that the content of water in the gas be 20 ppm or less, preferably 1 ppm or less, and further preferably 10 ppb or less. In this embodiment, for example, heat treatment is performed at 250° C. under a nitrogen atmosphere for 1 hour. Alternatively, RTA treatment for a short time at a high temperature may be performed before the formation of the conductive film 705 and the conductive film 706 in a manner similar to that of the previous heat treatment performed on the oxide semiconductor film. Even when oxygen deficiency is generated in the island-shaped oxide semiconductor film 704 by the previous heat treatment, by performing heat treatment after the insulating film 707 containing oxygen is provided, oxygen is supplied to the island-shaped oxide semiconductor film 704 from the insulating film 707. By supplying oxygen to the island-shaped oxide semiconductor film 704, oxygen deficiency that serves as a donor is reduced in the island-shaped oxide semiconductor film 704 and the stoichiometric ratio can be satisfied. As a result, the island-shaped oxide semiconductor film 704 can be made to be substantially i-type and variation in electric characteristics of the transistor due to oxygen deficiency can be reduced; thus, electric characteristics can be improved. The timing of this heat treatment is not particularly limited as long as it is after the formation of the insulating film 707. When this heat treatment doubles as another step such as heat treatment for formation of a resin film or heat treatment for reduction of the resistance of a light-transmitting conductive film, the island-shaped oxide semiconductor film 704 can be made to be substantially i-type without the number of steps increased.

Moreover, the oxygen deficiency that serves as a donor in the island-shaped oxide semiconductor film 704 may be reduced by subjecting the island-shaped oxide semiconductor film 704 to heat treatment in an oxygen atmosphere so that oxygen is added to the oxide semiconductor. The heat treatment is performed at a temperature of, for example, higher than or equal to 100° C. and lower than 350° C., preferably higher than or equal to 150° C. and lower than 250° C. It is preferable that an oxygen gas used for the heat treatment under an oxygen atmosphere do not include water, hydrogen, or the like. Alternatively, the purity of the oxygen gas which is introduced into the heat treatment apparatus is preferably greater than or equal to 6N (99.9999%) or more, further preferably greater than or equal to 7N (99.99999%) (that is, the impurity concentration in the oxygen is less than or equal to 1 ppm, or preferably less than or equal to 0.1 ppm).

Alternatively, oxygen may be added to the island-shaped oxide semiconductor film 704 by an ion implantation method or an ion doping method to reduce oxygen deficiency serving as a donor. For example, oxygen which is made into a plasma state by a microwave at 2.45 GHz may be added to the island-shaped oxide semiconductor film 704.

Note that a back gate electrode may be formed in a position overlapping with the island-shaped oxide semiconductor film 704 by forming a conductive film over the insulating film 707 and then patterning the conductive film. In the case where the back gate electrode is formed, an insulating film is preferably formed to cover the back gate electrode. The back gate electrode can be formed using a material and a structure similar to those of the gate electrode 702 and the conductive films 705 and 706.

The thickness of the back gate electrode is set to be 10 nm to 400 nm, preferably 100 nm to 200 nm. For example, the back gate electrode may be formed in a such a manner that a conductive film in which a titanium film, an aluminum film, and a titanium film are stacked is formed, a resist mask is formed by a photolithography method or the like, and unnecessary portions are removed by etching so that the conductive film is processed (patterned) into a desired shape.

Through the above-described process, the transistor 708 is formed.

The transistor 708 includes the gate electrode 702, the gate insulating film 703 over the gate electrode 702, the island-shaped oxide semiconductor film 704 which is over the gate insulating film 703 and overlaps with the gate electrode 702, and a pair of the conductive film 705 and the conductive film 706 formed over the island-shaped oxide semiconductor film 704. Further, the transistor 708 may include the insulating film 707 as its constituent. The transistor 708 illustrated in FIG. 6C has a channel-etched structure in which part of the island-shaped oxide semiconductor film 704 between the conductive film 705 and the conductive film 706 is etched.

Although the transistor 708 is described as a single-gate transistor, a multi-gate transistor including a plurality of channel formation regions can be manufactured when a plurality of the gate electrodes 702 electrically connected to each other is included, if needed.

This embodiment can be implemented in combination with any of the above-described embodiments.

Embodiment 3

In this embodiment, structural examples of a transistor will be described. Note that the same portions as those in the above embodiments and portions having functions similar to those in the above embodiments can be formed in a manner similar to that of the above embodiments. The same steps as those in the above embodiments and steps similar to those in the above embodiments can be conducted in a manner similar to those of the above embodiments. Therefore, the descriptions thereof are not repeated in this embodiment. In addition, detailed description of the same portion is not repeated, either.

Figure 7A:
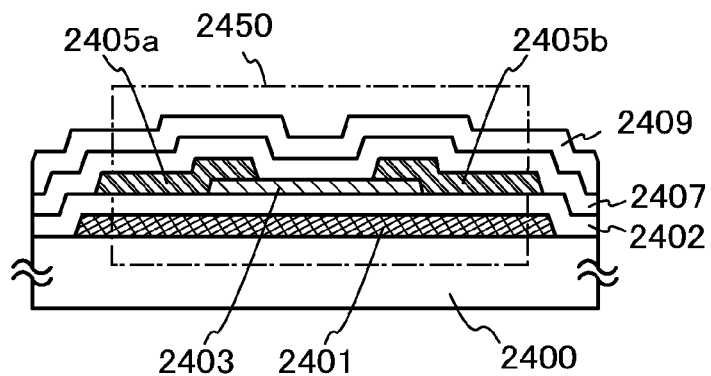
FIGS. 7A to 7D are cross-sectional views of transistors.

A transistor 2450 illustrated in FIG. 7A includes a gate electrode 2401 over a substrate 2400, a gate insulating film 2402 over the gate electrode 2401, an oxide semiconductor film 2403 over the gate insulating film 2402, and a source electrode 2405a and a drain electrode 2405b over the oxide semiconductor film 2403. An insulating film 2407 is formed over the oxide semiconductor film 2403, the source electrode 2405a, and the drain electrode 2405b. An insulating film 2409 may be formed over the insulating film 2407. The transistor 2450 is a bottom-gate transistor, and is also an inverted staggered transistor.

Figure 7B:
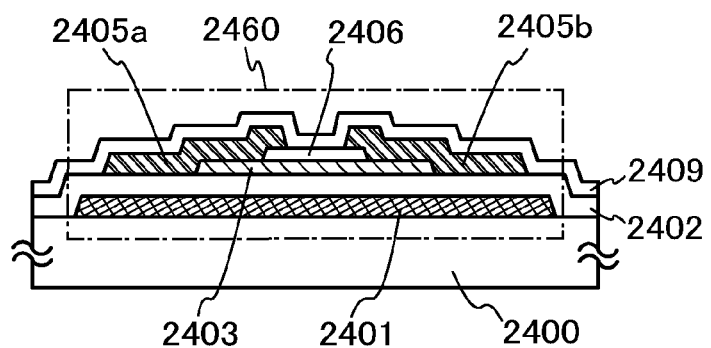

A transistor 2460 illustrated in FIG. 7B includes a gate electrode 2401 over a substrate 2400, a gate insulating film 2402 over the gate electrode 2401, an oxide semiconductor film 2403 over the gate insulating film 2402, a channel protective film 2406 over the oxide semiconductor film 2403, and a source electrode 2405a and a drain electrode 2405b over the channel protective film 2406 and the oxide semiconductor film 2403. An insulating film 2409 may be formed over the source electrode 2405a and the drain electrode 2405b. The transistor 2460 is a bottom-gate transistor called a channel-protective type (also referred to as a channel-stop type) transistor and is also an inverted staggered transistor. The channel protective film 2406 can be formed using a material and a method similar to those of other insulating films.

Figure 7C:
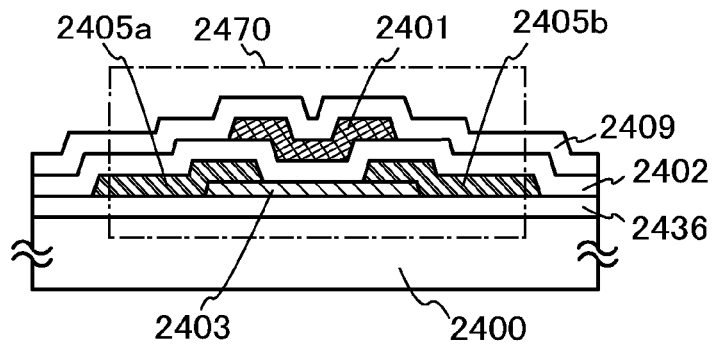

A transistor 2470 illustrated in FIG. 7C includes a base film 2436 over a substrate 2400, an oxide semiconductor film 2403 over the base film 2436, a source electrode 2405a and a drain electrode 2405b over the oxide semiconductor film 2403 and the base film 2436, a gate insulating film 2402 over the oxide semiconductor film 2403, the source electrode 2405a, and the drain electrode 2405b, and a gate electrode 2401 over the gate insulating film 2402. An insulating film 2409 may be formed over the gate electrode 2401. The transistor 2470 is a top-gate transistor.

Figure 7D:
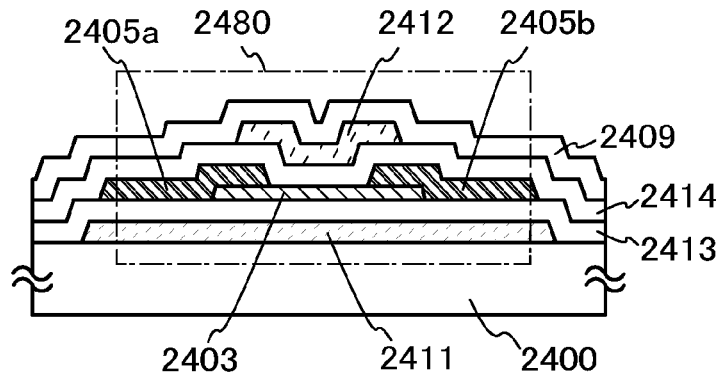

A transistor 2480 illustrated in FIG. 7D includes a gate electrode 2411 over a substrate 2400, a first gate insulating film 2413 over the gate electrode 2411, an oxide semiconductor film 2403 over the first gate insulating film 2413, and a source electrode 2405a and a drain electrode 2405b over the oxide semiconductor film 2403 and the first gate insulating film 2413. A second gate insulating film 2414 is formed over the oxide semiconductor film 2403, the source electrode 2405a, and the drain electrode 2405b, and a back gate electrode 2412 is formed over the second gate insulating film 2414. An insulating film 2409 may be formed over the back gate electrode 2412.

The transistor 2480 has a structure combining the transistor 2450 and the transistor 2470.

By changing a potential of the back gate electrode, the threshold voltage of the transistor can be changed. The back gate electrode is formed to overlap with a channel formation region of the oxide semiconductor film 2403. Further, the back gate electrode may be electrically insulated and in a floating state, or may be in a state where the back gate electrode is supplied with a potential. In the latter case, the back gate electrode may be supplied with a potential at the same level as that of the gate electrode, or may be supplied with a fixed potential such as a ground potential. By controlling the level of the potential applied to the back gate electrode, the threshold voltage of the transistor can be controlled.

When the oxide semiconductor film 2403 is completely covered with the back gate electrode, the source electrode 2405a, and the drain electrode 2405b, light from the back gate electrode side can be prevented from entering the oxide semiconductor film 2403. Therefore, photodegradation of the oxide semiconductor film 2403 can be prevented and a deterioration in characteristics such as a shift of the threshold voltage of the transistor can be prevented.

An insulating film in contact with the oxide semiconductor film 2403 (in this embodiment, corresponding to the gate insulating film 2402, the insulating film 2407, the channel protective film 2406, the base film 2436, the first gate insulating film 2413, and the second gate insulating film 2414) is preferably formed of an insulating material including a Group 13 element and oxygen. Many of oxide semiconductor materials include a Group 13 element, and an insulating material including a Group 13 element works well with an oxide semiconductor. By using an insulating material including a Group 13 element for an insulating film in contact with the oxide semiconductor, an interface with the oxide semiconductor can keep a favorable state.

An insulating material including a Group 13 element refers to an insulating material including one or more Group 13 elements. As the insulating material including a Group 13 element, a metal oxide such as gallium oxide, aluminum oxide, aluminum gallium oxide, and gallium aluminum oxide can be given for example. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, in the case of forming an insulating film in contact with an oxide semiconductor film containing gallium, a material including gallium oxide may be used as an insulating film, so that favorable characteristics can be kept at the interface between the oxide semiconductor film and the insulating film. When the oxide semiconductor film and the insulating film containing gallium oxide are provided in contact with each other, pileup of hydrogen at the interface between the oxide semiconductor film and the insulating film can be reduced, for example. Note that a similar effect can be obtained in the case where an element in the same group as a constituent element of the oxide semiconductor is used in an insulating film. For example, it is effective to form an insulating film with the use of a material including aluminum oxide. Note that aluminum oxide has a property of not easily transmitting water. Thus, it is preferable to use a material including aluminum oxide in terms of preventing entry of water to the oxide semiconductor film.

The insulating material of the insulating film in contact with the oxide semiconductor film 2403 preferably includes oxygen in a proportion higher than that in the stoichiometric composition (stoichiometric value), by heat treatment under an oxygen atmosphere or oxygen doping. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed using an ion implantation method or an ion doping method.

For example, in the case where the insulating film in contact with the oxide semiconductor film 2403 is formed of gallium oxide, the composition of gallium oxide can be set to be $Ga_2O_x$ ($x=3+\alpha$, $0<\alpha<1$) by heat treatment under an oxygen atmosphere or oxygen doping.

In the case where the insulating film in contact with the oxide semiconductor film 2403 is formed of aluminum oxide, the composition of aluminum oxide can be set to be $Al_2O_x$ ($x=3+\alpha$, $0<\alpha<1$) by heat treatment under an oxygen atmosphere or oxygen doping.

In the case where the insulating film in contact with the oxide semiconductor film 2403 is formed of gallium aluminum oxide (aluminum gallium oxide), the composition of gallium aluminum oxide (aluminum gallium oxide) can be set to be $Ga_xAl_{2-x}O_{3+\alpha}$ ($0<x<2$, $0<\alpha<1$) by heat treatment under an oxygen atmosphere or oxygen doping.

By oxygen doping, an insulating film which includes a region where the proportion of oxygen is higher than that in the stoichiometric composition can be formed. When the insulating film including such a region is in contact with the oxide semiconductor film, oxygen that exists excessively in the insulating film is supplied to the oxide semiconductor film, and oxygen deficiency in the oxide semiconductor film or at an interface between the oxide semiconductor film and the insulating film is reduced. Thus, the oxide semiconductor film can be formed to an i-type or substantially i-type oxide semiconductor.

The insulating film which includes a region where the proportion of oxygen is higher than that in the stoichiometric composition may be applied to either the insulating film located on the upper side of the oxide semiconductor film or the insulating film located on the lower side of the oxide semiconductor film of the insulating films in contact with the oxide semiconductor film 2403; however, it is preferable to apply such an insulating film to both of the insulating films in contact with the oxide semiconductor film 2403. The above-described effect can be enhanced with a structure where the oxide semiconductor film 2403 is sandwiched between the insulating films which each include a region where the proportion of oxygen is higher than that in the stoichiometric composition, which are used as the insulating films in contact with the oxide semiconductor film 2403 and located on the upper side and the lower side of the oxide semiconductor film 2403.

The insulating films on the upper side and the lower side of the oxide semiconductor film 2403 may include the same constituent element or different constituent elements. For example, the insulating films on the upper side and the lower side may be both formed of gallium oxide whose composition is $Ga_2O_x$ ($x=3+\alpha$, $0<\alpha<1$). Alternatively, one of the insulating films on the upper side and the lower side may be formed of $Ga_2O_x$ ($x=3+\alpha$, $0<\alpha<1$) and the other may be formed of aluminum oxide whose composition is $Al_2O_x$ ($x=3+\alpha$, $0<\alpha<1$).

The insulating film in contact with the oxide semiconductor film 2403 may be formed by stacking insulating films which each include a region where the proportion of oxygen is higher than that in the stoichiometric composition. For example, the insulating film on the upper side of the oxide semiconductor film 2403 may be formed as follows: gallium oxide whose composition is $Ga_2O_x$ ($x=3+\alpha$, $0<\alpha<1$) is formed and gallium aluminum oxide (aluminum gallium oxide) whose composition is $Ga_xAl_{2-x}O_{3+\alpha}$ ($0<x<2$, $0<\alpha<1$) may be formed thereover. Note that the insulating film on the lower side of the oxide semiconductor film 2403 may be formed by stacking insulating films which each include a region where the proportion of oxygen is higher than that in the stoichiometric composition. Further, both of the insulating films on the upper side and the lower side of the oxide semiconductor film 2403 may be formed by stacking insulating films which each include a region where the proportion of oxygen is higher than that in the stoichiometric composition.

This embodiment can be implemented in combination with any of the other embodiments as appropriate.

Embodiment 4

In this embodiment, an example of calculation of the off-state current of a transistor will be described.

Figure 8:
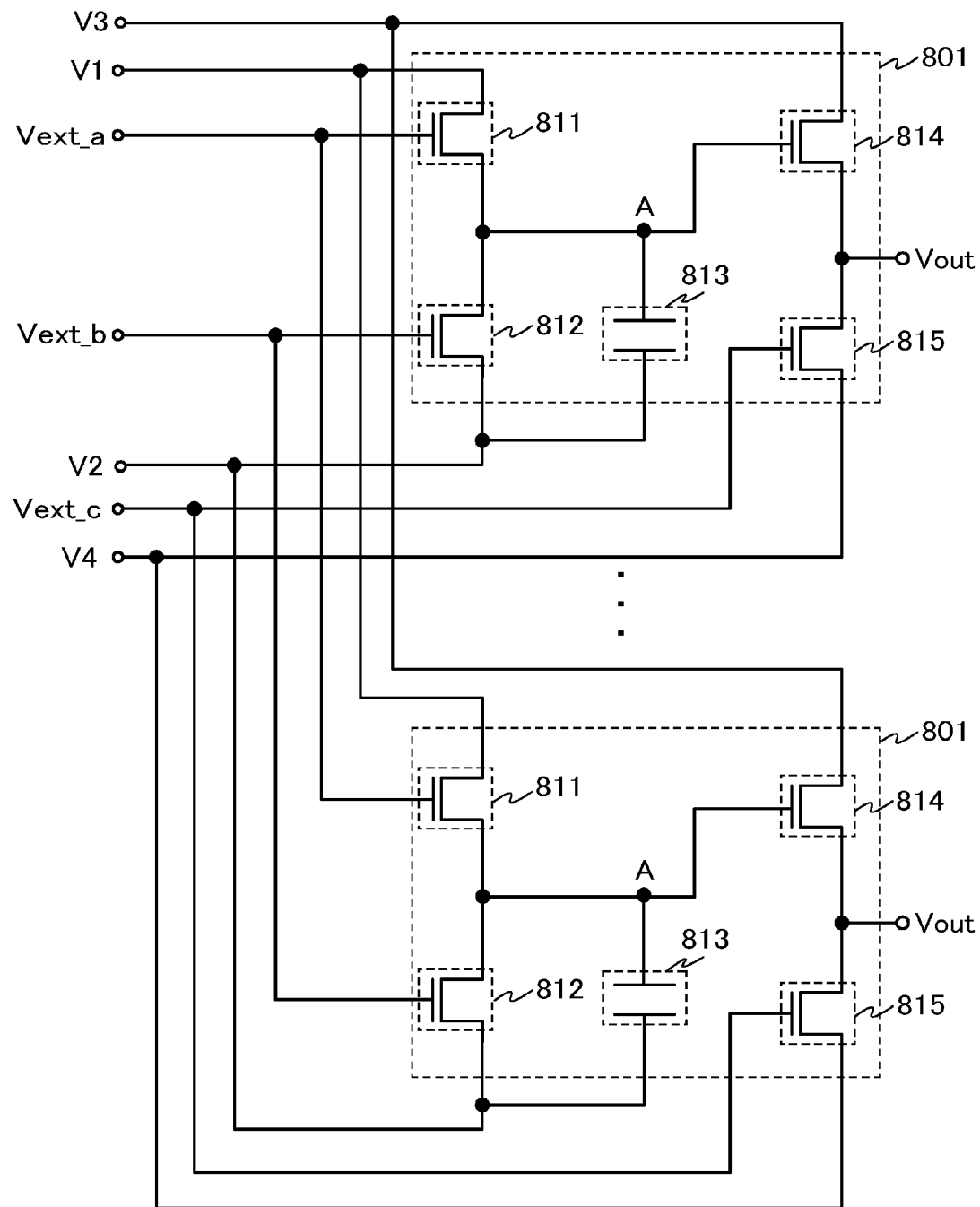
FIG. 8 is a circuit diagram of a circuit for evaluating characteristics.

First, a configuration of a circuit for evaluating characteristics, which is used in calculation of the off-state current, will be described with reference to FIG. 8. In this embodiment, the circuit for evaluating characteristics includes a plurality of measurement systems 801 connected in parallel to each other. FIG. 8 illustrates a circuit for evaluating characteristics in which eight measurement systems 801 are connected in parallel to each other, as an specific example.

The measurement systems 801 each includes a transistor 811, a transistor 812, a capacitor 813, a transistor 814, and a transistor 815.

The transistor 811 is a transistor for injection of electric charge. A first terminal of the transistor 811 is connected to a node to which a potential V1 is applied, and a second terminal thereof is connected to a first terminal of the transistor 812. A gate electrode of the transistor 811 is connected to a node to which a potential Vext_a is applied.

The transistor 812 is a transistor for evaluation of leakage current. Note that the leakage current in this embodiment means leakage current including an off-state current of the transistor. The first terminal of the transistor 812 is connected to the second terminal of the transistor 811, and a second terminal thereof is connected to a node to which a potential V2 is applied. A gate electrode of the transistor 812 is connected to a node to which a potential Vext_b is applied.

A first electrode of the capacitor 813 is connected to the second terminal of the transistor 811 and the first terminal of the transistor 812. A second electrode of the capacitor 813 is connected to the node to which the potential V2 is applied.

A first terminal of the transistor 814 is connected to a node to which a potential V3 is applied, and a second terminal thereof is connected to a first terminal of the transistor 815. A gate electrode of the transistor 814 is connected to the second terminal of the transistor 811, the first terminal of the transistor 812, and the first electrode of the capacitor 813; this point to which the gate electrode of the transistor 814 is connected is denoted by a node A.

The first terminal of the transistor 815 is connected to the second terminal of the transistor 814, and a second terminal of the transistor 815 is connected to a node to which a potential V4 is applied. A gate electrode of the transistor 815 is connected to a node to which a potential Vext_c is applied.

The measurement system 801 outputs a potential of a node to which the second terminal of the transistor 814 and the first terminal of the transistor 815 are connected as a potential Vout of an output signal.

In this embodiment, a transistor which includes an oxide semiconductor in an active layer and includes a channel formation region which is included in the active layer and has a channel length L of 10 μm and a channel width W of 10 μm is used as the transistor 811.

Note that a channel formation region corresponds to a region of a semiconductor film, which exists between a source electrode and a drain electrode and overlaps with a gate electrode with a gate insulating film provided therebetween.

For the transistor 814 and the transistor 815, transistors which include an oxide semiconductor in an active layer and includes a channel formation region which is included in the active layer and has a channel length L of 3 μm and a channel width W of 100 μm are used.

In addition, as the transistor 812, a bottom-gate transistor which includes an oxide semiconductor in an active layer, which includes a source electrode and a drain electrode in contact with upper portions of the active layer, which does not include an overlap region where a source electrode and a drain electrode overlap with a gate electrode, and which includes an offset region having a width of 1 μm is used. Providing the offset region can reduce parasitic capacitance. As the transistor 812, transistors whose channel formation regions included in active layers have various sizes as noted in Condition 1 to Condition 6 in Table 1 are used.

TABLE 1

|  | Channel length L [μm] | Channel width W [μm] |
|---|---|---|
| Condition 1 | 1.5 | $1 \times 10^5$ |
| Condition 2 | 3 | $1 \times 10^5$ |

TABLE 1-continued

|  | Channel length L [μm] | Channel width W [μm] |
|---|---|---|
| Condition 3 | 10 | $1 \times 10^5$ |
| Condition 4 | 1.5 | $1 \times 10^6$ |
| Condition 5 | 3 | $1 \times 10^6$ |
| Condition 6 | 10 | $1 \times 10^6$ |

In the case of not providing the transistor 811 for injection of electric charge in the measurement system 801, the transistor 812 for evaluation of leakage current needs to be turned on at the time of injecting electric charge to the capacitor 813. In this case, if the transistor 812 for evaluation of leakage current is an element that requires a long time to turn into a steady off-state from an on-state, the measurement would take a long time. By separately providing the transistor 811 for injection of electric charge and a transistor 812 for evaluation of leakage current as illustrated in FIG. 8, the transistor 812 for evaluation of leakage current can be always kept off at the time of injection of electric charge. Thus, time required for measurement can be shortened.

In addition, by separately providing the transistor 811 for injection of electric charge and the transistor 812 for evaluation of leakage current in the measurement system 801, each of these transistors can be of proper sizes. Further, by making the channel width W of the transistor 812 for evaluation of leakage current larger than that of the transistor 811 for injection of electric charge, the leakage current inside the circuit for evaluating characteristics except for the leakage current of the transistor 812 for evaluation of leakage current can be made relatively low. As a result, the leakage current of the transistor 812 for evaluation of leakage current can be measured with high accuracy. Further, since the transistor 812 for evaluation of leakage current does not need to be turned on at the time of injection of electric charge, the influence of fluctuations in the potential of the node A caused by part of the electric charge in the channel formation region flowing into the node A can be prevented.

On the other hand, by making the channel width W of the transistor 811 for injection of electric charge smaller than that of the transistor 812 for evaluation of leakage current, the leakage current of the transistor 811 for injection of electric charge can be made relatively low. Further, fluctuations in the potential of the node A caused by part of the electric charge in the channel formation region flowing into the node A, has little influence at the time of injection of electric charge.

In addition, by connecting the plurality of measurement systems 801 in parallel to each other as illustrated in FIG. 8, the leakage current of the circuit for evaluating characteristics can be calculated with higher accuracy.

Next, a specific method for calculating the off-state current of a transistor with the use of the circuit for evaluating characteristics illustrated in FIG. 8 will be described.

Figure 9:
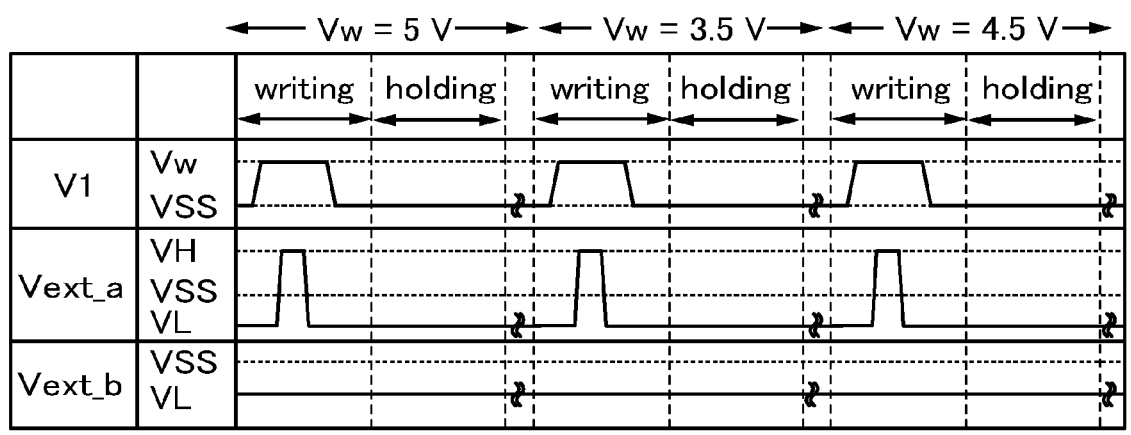
FIG. 9 is a timing chart of a circuit for evaluating characteristics.

First, a method for calculating the leakage current with the circuit for evaluating characteristics illustrated in FIG. 8 will be described with referent to FIG. 9. FIG. 9 is a timing chart used to describe the method for calculating the leakage current with the circuit for evaluating characteristics illustrated in FIG. 8.

In the method for calculating the leakage current with the circuit for evaluating characteristics illustrated in FIG. 8, there are a writing period and a holding period. The operation in each period is described below. Note that in both the writing period and the holding period, it is assumed that the potential V2 and the potential V4 are 0 V, the potential V3 is 5 V, and the potential Vext_c is 0.5 V.

First, in the writing period, the potential Vext_b is set to a potential VL (−3 V) with which the transistor 812 is off. The potential V1 is set to a writing potential Vw, and then, the potential Vext_a is set to a potential VH (5 V) with which the transistor 811 is in an on state, for a certain period. In the above-described manner, electric charge is accumulated in the node A, and the potential of the node A becomes equivalent to the writing potential Vw. Then, the potential Vext_a is set to a potential VL with which the transistor 811 is off. Then, the potential V1 is set to a potential VSS (0 V).

Next, in the holding period, the amount of change in the potential of the node A, caused by a change in the amount of electric charge accumulated in the node A, is measured. From the amount of change in the potential, the value of the current flowing between the source electrode and the drain electrode of the transistor 812 can be calculated. Thus, the electric charge of the node A can be accumulated, and the amount of change in the potential of the node A can be measured.

Accumulation of electric charge of the node A and measurement of the amount of change in the potential of the node A (also referred to as the accumulation and measurement operation) are repeatedly performed. First, a first accumulation and measurement operation is repeated 15 times. In the first accumulation and measurement operation, a potential of 5 V as the writing potential Vw is input in the writing period, and held for one hour in the holding period. Next, a second accumulation and measurement operation is repeated twice. In the second accumulation and measurement operation, a potential of 3.5 V as the writing potential Vw is input in the writing period, and held for 50 hours in the holding period. Next, a third accumulation and measurement operation is performed once. In the third accumulation and measurement operation, a potential of 4.5 V as the writing potential Vw is input in the writing period, and held for 10 hours in the holding period. By repeating the accumulation and measurement operation, it can be confirmed that the measured current value becomes a value in the steady state. In other words, the transient current (a current component which decreases over time after the start of the measurement) can be removed from the current $I_A$ flowing through the node A. As a result, the leakage current can be measured with higher accuracy.

In general, the potential $V_A$ denoting the potential of the node A can be expressed as a function of the potential Vout of the output signal by the following equation.

$$V_A = F(Vout) \quad \text{[Formula 1]}$$

Electric charge $Q_A$ of the node A can be expressed by the following equation with the use of the potential $V_A$ of the node A, capacitance $C_A$ connected to the node A, and a constant (const). The capacitance $C_A$ connected to the node A is the sum of the capacitance of the capacitor 813 and the capacitance other than the capacitance of the capacitor 813.

$$Q_A = C_A V_A + \text{const} \quad \text{[Formula 2]}$$

Since current $I_A$ of the node A is the time derivative of electric charge flowing into the node A (or electric charge flowing from the node A), the current $I_A$ of the node A cab be expressed by the following equation.

$$I_A \equiv \frac{\Delta Q_A}{\Delta t} = \frac{C_A \cdot \Delta F(Vout)}{\Delta t} \quad \text{[Formula 3]}$$

Here, as an example, Δt is about 54000 sec. The current $I_A$ of the node A can be calculated using the capacitance $C_A$ connected to the node A and the potential Vout of the output signal, and the leakage current of the circuit for evaluating characteristics can be accordingly obtained.

Next, the measured results of the potential Vout of the output signal by the measurement method using the above circuit for evaluating characteristics are shown, and the value of the leakage current of the circuit for evaluating characteristics, which is calculated from the measurement results, is shown.

Figure 10:
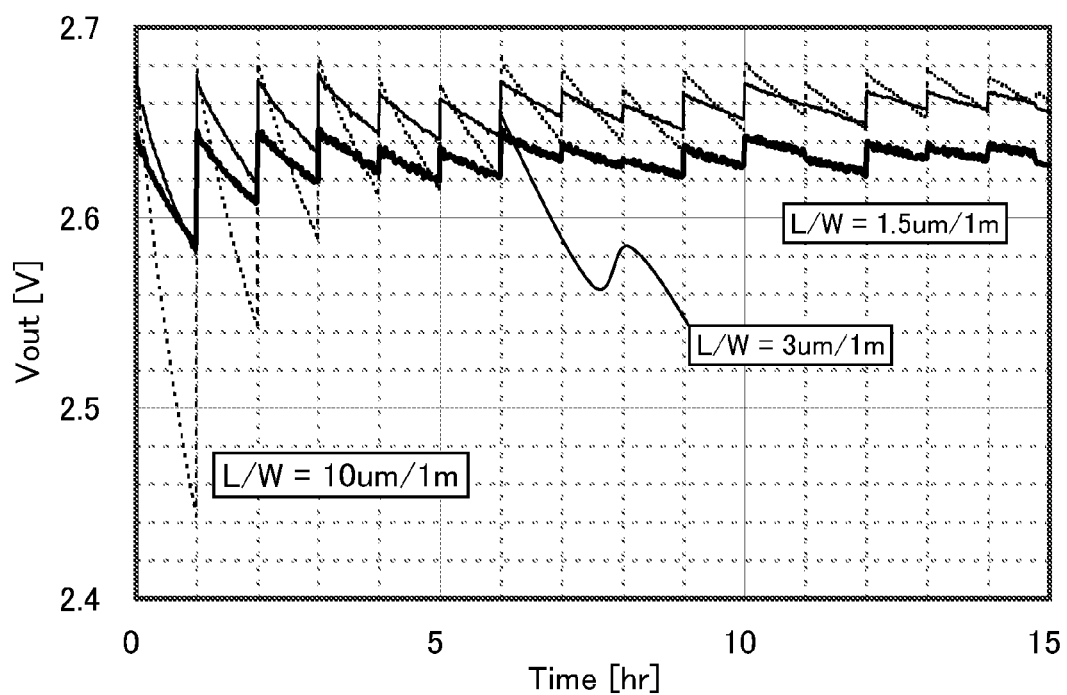
FIG. 10 shows a relation between the time and the potential Vout of an output signal in a circuit for evaluating characteristics.
Figure 11:
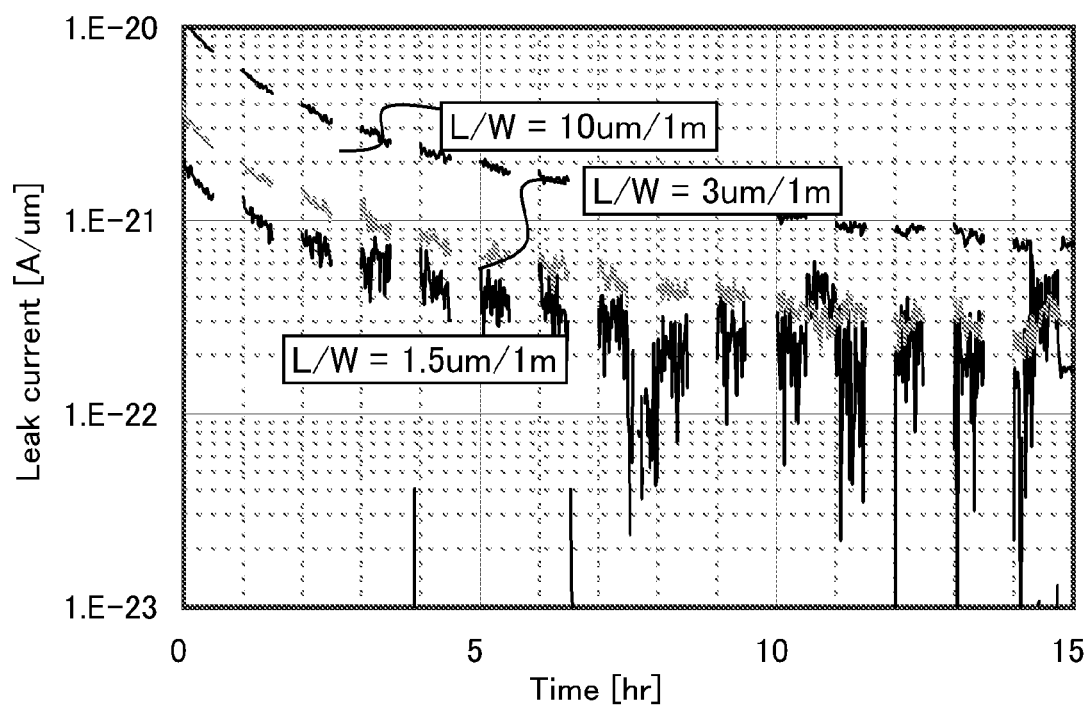
FIG. 11 shows a relation between the time and the leakage current obtained by measurement in a circuit for evaluating characteristics.

FIG. 10 shows the relation between the potential Vout of the output signal and the time in the measurement (the first accumulation and measurement operation) under Condition 1, Condition 2, and Condition 3 as examples. FIG. 11 shows the relation between the leakage current calculated by the measurement and the time in the measurement. It was found that the potential Vout of the output signal varies after the start of the measurement and time required for obtaining the steady state is 10 hours or longer.

Figure 12:
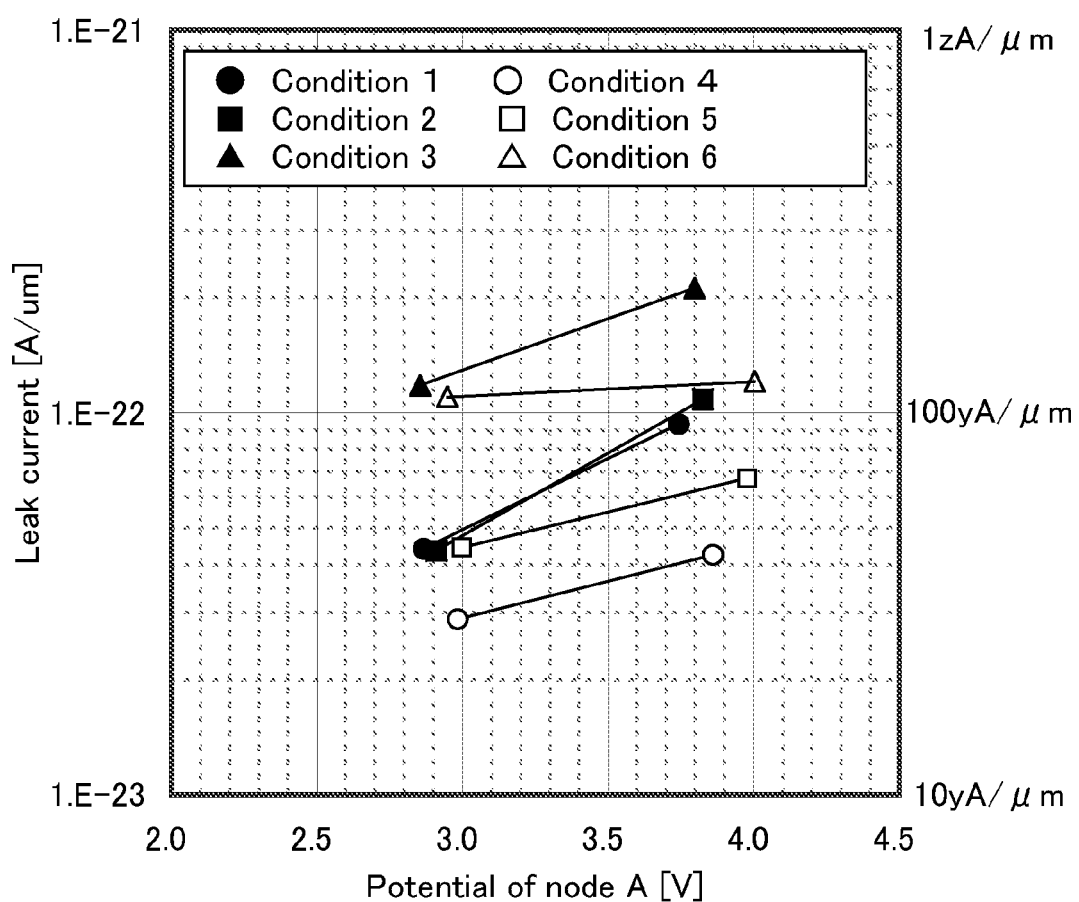
FIG. 12 shows a relation between the potential of a node A and the leakage current in a circuit for evaluating characteristics.

FIG. 12 shows the relation between the leakage current and the potential of the node A under Conditions 1 to 6 obtained from the measurement. According to FIG. 12, in Condition 4 for example, when the potential of the node A is 3.0 V, the leakage current is 28 yA/μm. Since the leakage current includes the off-state current of the transistor 812, the off-state current of the transistor 812 can be considered to be lower than or equal to 28 yA/μm.

As described above, in a circuit for evaluating characteristics, which includes a transistor including a purified oxide semiconductor layer having a function as a channel formation layer, the leakage current is sufficiently low. Therefore, it was confirmed that the off-state current of the transistor is sufficiently low.

Embodiment 5

In this embodiment, a structure of a driver circuit in a liquid crystal display device using a driving method according to an embodiment of the present invention will be described.

Figure 13:
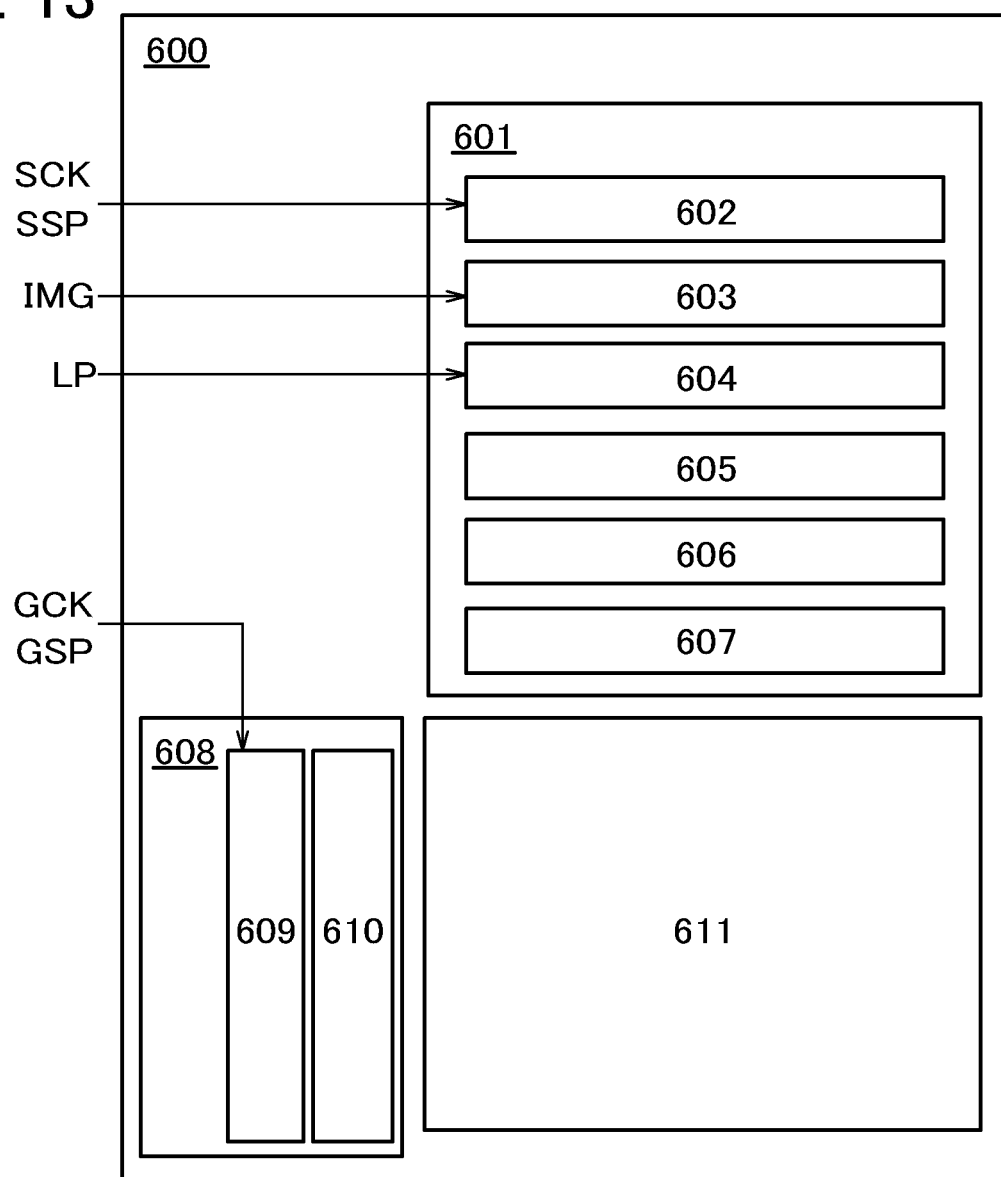
FIG. 13 is a block diagram of a liquid crystal display device.

FIG. 13 is a block diagram illustrating an example of a structure of a liquid crystal display device. Although the block diagram shows elements classified according to their functions in independent blocks, it may be practically difficult to completely separate the elements according to their functions and, in some cases, one element may be involved in a plurality of functions.

A liquid crystal display device 600 illustrated in FIG. 13 includes a pixel portion 611, a signal line driver circuit 601, and a scan line driver circuit 608. The signal line driver circuit 601 includes a shift register 602, a first memory circuit 603, a second memory circuit 604, a level shifter 605, a DAC 606, and an analog buffer 607. In addition, the scan line driver circuit 608 includes a shift register 609 and a digital buffer 610.

Next, operation of the liquid crystal display device 600 illustrated in FIG. 13 will be described. When a start signal SSP and a clock signal SCK are input to the shift register 602, the shift register 602 generates a timing signal whose pulse is sequentially shifted.

An image signal IMG is input to the first memory circuit 603. The image signal IMG includes a pulse having a positive polarity and a pulse having a negative polarity. When the timing signal is input to the first memory circuit 603, the image signal IMG is sampled in accordance with a pulse of the timing signal and sequentially written to a plurality of memory elements included in the first memory circuit 603. That is, the image signal IMG which is input to the signal line driver circuit 601 in series is written to the first memory circuit 603 in parallel. The image signal IMG written to the first memory circuit 603 is held.

Note that the image signal IMG may be sequentially written to a plurality of memory elements included in the first memory circuit 603; or so-called division driving may be performed, in which the plurality of memory elements included in the first memory circuit 603 is divided into several groups and the image signal IMG is input to the groups in parallel. Note that the number of memory elements in each group in this case is referred to as the number of divisions. For example, in the case where a memory circuit is divided into groups so that each group has four memory elements, division driving is performed with four divisions.

A latch signal LP is input to the second memory circuit 604. After writing of the image signal IMG to the first memory circuit 603 is completed, the image signal IMG held in the first memory circuit 603 is written to the second memory circuit 604 and held therein all at once in accordance with a pulse of a latch signal LP input to the second memory circuit 604 in a retrace period. Again, in accordance with the timing signal from the shift register 602, the next image signal IMG is sequentially written to the first memory circuit 603 in which transmission of the image signal IMG to the second memory circuit 604 has been completed. In the one line period of the second round, the image signal IMG which is written to and held in the second memory circuit 604 is transmitted to the DAC 606 after the amplitude of the voltage is adjusted in the level shifter 605. In the DAC 606, the image signal IMG which is input is converted from a digital signal to an analog signal. Then, the image signal IMG which is converted to an analog signal is transmitted to the analog buffer 607. The image signal IMG transmitted from the DAC 606 is transmitted from the analog buffer 607 to the pixel portion 611 through a signal line.

In contrast, in the scan line driver circuit 608, when a start signal GSP and a clock signal GCK are input to the shift register 609, a scan signal SCN whose pulse is sequentially shifted is generated. The scan signal SCN output from the shift register 602 is transmitted from the digital buffer 610 to the pixel portion 611 through a scan line.

The pixel included in the pixel portion 611 is selected by the scan signal SCN input from the scan line driver circuit 608. The image signal IMG transmitted from the signal line driver circuit 601 to the pixel portion 611 through the signal line is input to the above-described selected pixel.

In the liquid crystal display device 600 illustrated in FIG. 13, the start signal SSP, the clock signal SCK, the latch signal LP, and the like correspond to driving signals of the signal line driver circuit 601. In addition, the start signal GSP, the clock signal GCK, and the like correspond to driving signals of the scan line driver circuit 608.

In a period in which a still image is displayed, the supply of the driving signals and the power supply potential may be stopped; in this way, the number of writing operations of the image signal IMG to the pixel portion 611 can be reduced, and power consumption of the liquid crystal display device can be reduced.

This embodiment can be implemented in combination with any of the above-described embodiments as appropriate.

Embodiment 6

In this embodiment, a structure of a liquid crystal display device according to an embodiment of the present invention will be described.

Figure 14:
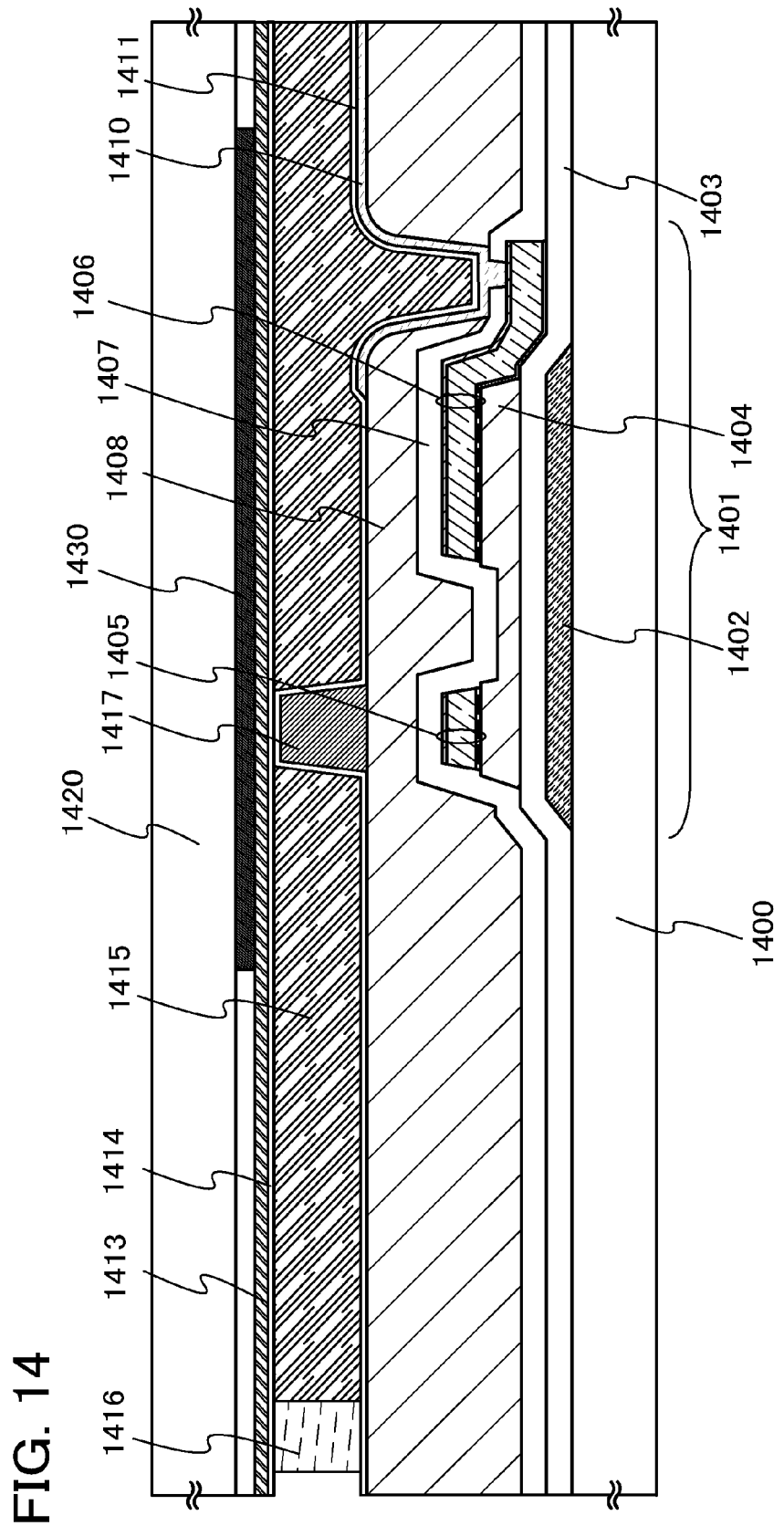
FIG. 14 is a cross-sectional view of a pixel.

FIG. 14 illustrates an example of a cross-sectional view of a pixel in the liquid crystal display device according to an embodiment of the present invention. A transistor 1401 illustrated in FIG. 14 includes a gate electrode 1402 formed over a substrate 1400 having an insulating surface, a gate insulating film 1403 over the gate electrode 1402, an oxide semiconductor film 1404 which is over the gate insulating film 1403 and which overlaps with the gate electrode 1402, and a conductive film 1405 and a conductive film 1406 which function as a source electrode and a drain electrode and which are formed over the oxide semiconductor film 1404. Further, the transistor 1401 may include an insulating film 1407 formed over the oxide semiconductor film 1404 as a constituent. The insulating film 1407 is formed so as to cover the gate electrode 1402, the gate insulating film 1403, the oxide semiconductor film 1404, the conductive film 1405, and the conductive film 1406.

An insulating film 1408 is formed over the insulating film 1407. An opening is provided in part of the insulating film 1407 and the insulating film 1408, and a pixel electrode 1410 is formed so as to be in contact with the conductive film 1406 in the opening.

Further, a spacer 1417 for controlling a cell gap of a liquid crystal element is formed over the insulating film 1408. The spacer 1417 can be formed by etching an insulating film into a desired shape. A cell gap may also be controlled by dispersing a filler over the insulating film 1408.

An alignment film 1411 is formed over the pixel electrode 1410. Further, a counter electrode 1413 is provided in a position that faces the pixel electrode 1410, and an alignment film 1414 is formed on the side closer to the pixel electrode 1410 of the counter electrode 1413. The alignment film 1411 and the alignment film 1414 can be formed using an organic resin such as polyimide or poly(vinyl alcohol). Alignment treatment such as rubbing is performed on their surfaces in order to align liquid crystal molecules in a certain direction. Rubbing can be performed by rolling a roller wrapped with cloth of nylon or the like while applying pressure on the alignment films so that the surfaces of the alignment films are rubbed in a certain direction. Note that it is also possible to form the alignment films 1411 and 1414 having alignment characteristics by using an inorganic material such as silicon oxide by an evaporation method, without an alignment process.

Furthermore, a liquid crystal 1415 is provided in a region which is surrounded by a sealant 1416 between the pixel electrode 1410 and the counter electrode 1413. Injection of the liquid crystal 1415 may be performed by a dispenser method (dripping method) or a dipping method (pumping method). Note that a filler may be mixed in the sealant 1416.

The liquid crystal element formed using the pixel electrode 1410, the counter electrode 1413, and the liquid crystal 1415 may overlap with a color filter through which light in a particular wavelength region can pass. The color filter may be formed on a substrate (counter substrate) 1420 provided with the counter electrode 1413. The color filter can be selectively formed by photolithography after application of an organic resin such as an acrylic-based resin in which pigment is dispersed over the substrate 1420. Alternatively, the color filter can be selectively formed by etching after application of a polyimide-based resin in which pigment is dispersed over the substrate 1420. Alternatively, the color filter can be selectively formed by a droplet discharge method such as an ink jet method.

Further, a blocking film 1430 capable of blocking light is formed over the substrate 1420. By providing the blocking film 1430 so as to overlap with the oxide semiconductor film

1404 as illustrated in FIG. 14, light from the substrate 1420 side can be prevented from entering the oxide semiconductor film 1404. Therefore, photodegradation of the oxide semiconductor film 1404 is not caused, whereby a deterioration in characteristics such as a shift of the threshold voltage of the transistor 1401 can be prevented. Further, by providing the blocking film 1430 between pixels, disclination caused by disorder of the orientation of the liquid crystal 1415 between pixels can be prevented. An organic resin containing black pigment such as carbon black or low-valent titanium oxide whose oxidation number is smaller than that of titanium dioxide can be used for the blocking film. Alternatively, a film of chromium can be used for the blocking film.

Further, when the oxide semiconductor film 1404 is formed in a position so that the whole of the oxide semiconductor film 1404 completely overlaps with the gate electrode 1402 as illustrated in FIG. 14, light from the substrate 1400 side can be prevented from entering the oxide semiconductor film 1404. Therefore, photodegradation of the oxide semiconductor film 1404 is not caused and a deterioration in characteristics such as a shift of the threshold voltage of the transistor 1401 can be prevented.

The pixel electrode 1410 and the counter electrode 1413 can be formed using a transparent conductive material such as a mixed oxide of indium oxide and tin oxide including silicon oxide (ITSO), a mixed oxide of indium oxide and tin oxide, zinc oxide (ZnO), indium zinc oxide (IZO), or zinc oxide to which gallium is added (GZO), for example.

Moreover, the following methods can be used for driving the liquid crystal, for example: a TN (twisted nematic) mode, an STN (super twisted nematic) mode, a VA (vertical alignment) mode, an MVA (multi-domain vertical alignment) mode, an IPS (in-plane-switching) mode, an OCB (optically compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a PNLC (polymer network liquid crystal) mode, and a guest-host mode.

Alternatively, a liquid crystal exhibiting a blue phase for which an alignment film is unnecessary may be used as the liquid crystal 1415. A blue phase is one of liquid crystal phases, which is generated just before a cholesteric phase changes into an isotropic phase when the temperature of cholesteric liquid crystal is increased. Since the blue phase is only generated within a narrow range of temperature, a chiral agent or an ultraviolet curable resin is added so that the temperature range is improved. The liquid crystal composition which includes a liquid crystal exhibiting a blue phase and a chiral agent is preferable because it has a small response time of 10 μsec to 100 μsec, has optical isotropy, which makes the alignment process unneeded, and has a small viewing angle dependence.

Figure 15:
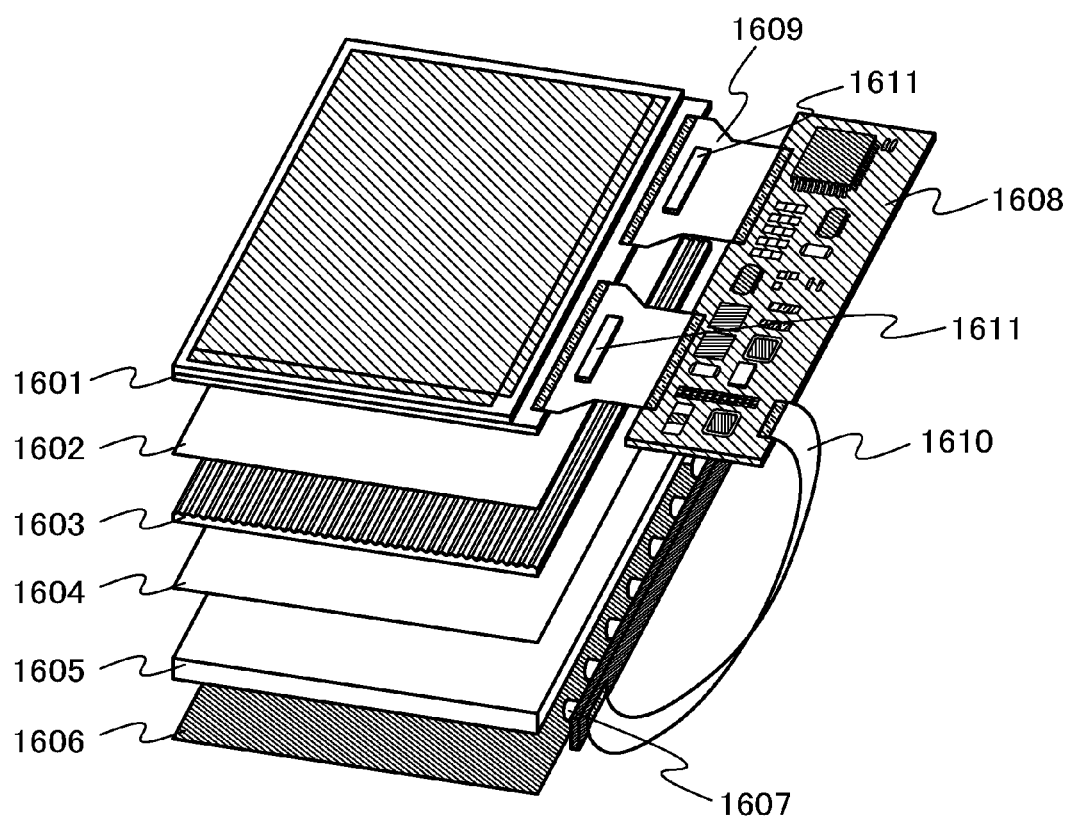
FIG. 15 is a perspective view of a structure of a liquid crystal display device.

FIG. 15 illustrates an example of a perspective view illustrating a structure of a liquid crystal display device according to an embodiment of the present invention. The liquid crystal display device illustrated in FIG. 15 includes a panel 1601 in which a pixel portion is formed between a pair of substrates, a first diffuser plate 1602, a prism sheet 1603, a second diffuser plate 1604, a light guide plate 1605, a reflective plate 1606, a light source 1607, a circuit board 1608, and a first substrate 1611.

The panel 1601, the first diffuser plate 1602, the prism sheet 1603, the second diffuser plate 1604, the light guide plate 1605, and the reflective plate 1606 are sequentially stacked. The light source 1607 is provided at an end portion of the light guide plate 1605. Light from the light source 1607 is diffused inside the light guide plate 1605 and is uniformly delivered to the panel 1601 with the help of the first diffuser plate 1602, the prism sheet 1603, and the second diffuser plate 1604.

Although the first diffuser plate 1602 and the second diffuser plate 1604 are used in this embodiment, the number of diffuser plates is not limited thereto. The number of diffuser plates may be one, or may be three or more. The diffuser plate may be provided between the light guide plate 1605 and the panel 1601. Therefore, the diffuser plate may be provided only on the side closer to the panel 1601 than the prism sheet 1603, or may be provided only on the side closer to the light guide plate 1605 than the prism sheet 1603.

Further, the cross section of the prism sheet 1603 is not limited to a sawtooth shape illustrated in FIG. 15. The prism sheet 1603 may have a shape with which light from the light guide plate 1605 can be concentrated on the panel 1601 side.

The circuit board 1608 is provided with a circuit which generates various signals input to the panel 1601, a circuit which processes the signals, or the like. In FIG. 15, the circuit board 1608 and the panel 1601 are connected to each other with a COF tape 1609. Further, the first substrate 1611 is connected to the COF tape 1609 by a chip on film (COF) method.

FIG. 15 illustrates an example in which the circuit board 1608 is provided with a control circuit which controls driving of the light source 1607 and the control circuit and the light source 1607 are connected to each other with the FPC 1610. However, the above-described control circuit may be formed over the panel 1601, and in that case, the panel 1601 and the light source 1607 are made to be connected to each other with an FPC or the like.

Although FIG. 15 illustrates an edge-light type light source in which the light source 1607 is provided at an end portion of the panel 1601, a liquid crystal display device of the present invention may be a direct-below type in which the light source 1607 is provided directly below the panel 1601.

This embodiment can be implemented in combination with any of the above-described embodiments as appropriate.

EXAMPLE 1

With the use of a liquid crystal display device in which a driving method according to an embodiment of the present invention is employed, an electronic device with low power consumption or an electronic device capable of displaying a high-quality image can be provided.

The liquid crystal display device can be used for display devices, laptops, or image reproducing devices provided with recording media (typically devices which reproduce the content of recording media such as DVDs (digital versatile disc) and have displays for displaying the reproduced images). In addition to the above examples, as electronic devices which can include the liquid crystal display device employing a driving method according to an embodiment of the present invention, mobile phones, portable game machines, portable information terminals, e-book readers, video cameras, digital still cameras, goggle-type displays (head mounted displays), navigation systems, audio reproducing devices (e.g., car audio components and digital audio players), copiers, facsimiles, printers, multifunction printers, automated teller machines (ATM), vending machines, and the like can be given. Specific examples of these electronic devices are illustrated in FIGS. 16A to 16D.

Figure 16A:
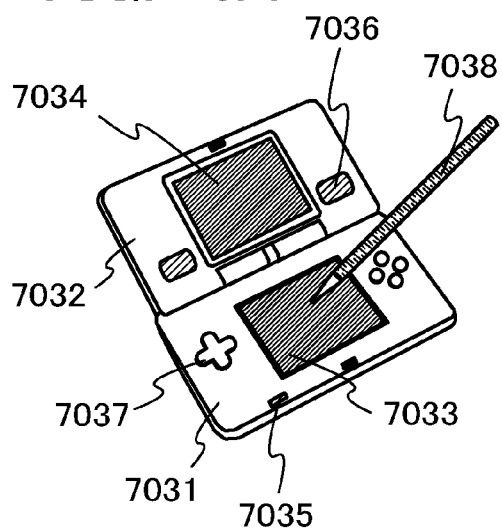
FIGS. 16A to 16D illustrate electronic devices.

FIG. 16A illustrates a portable game machine including a housing 7031, a housing 7032, a display portion 7033, a display portion 7034, a microphone 7035, speakers 7036, an operation key 7037, a stylus 7038, and the like. A liquid crystal display device in which a driving method according to an embodiment of the present invention is employed can be used for the display portion 7033 and/or the display portion 7034. By using the liquid crystal display device in which a driving method according to an embodiment of the present invention is employed for the display portion 7033 and/or the display portion 7034, the portable game machine can have low power consumption and can display a high-quality image. Note that the portable game machine illustrated in FIG. 16A has the two display portions 7033 and 7034. However, the number of display portions included in the portable game machine is not limited thereto.

Figure 16B:
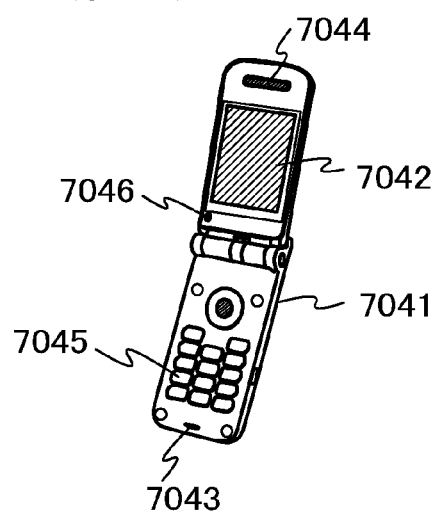

FIG. 16B illustrates a mobile phone including a housing 7041, a display portion 7042, an audio-input portion 7043, an audio-output portion 7044, operation keys 7045, a light-receiving portion 7046, and the like. Light received in the light-receiving portion 7046 is converted into electric signals, whereby external images can be loaded. A liquid crystal display device in which a driving method according to an embodiment of the present invention is employed can be used for the display portion 7042. By using the liquid crystal display device in which a driving method according to an embodiment of the present invention is employed for the display portion 7042, the mobile phone can have low power consumption and can display a high-quality image.

Figure 16C:
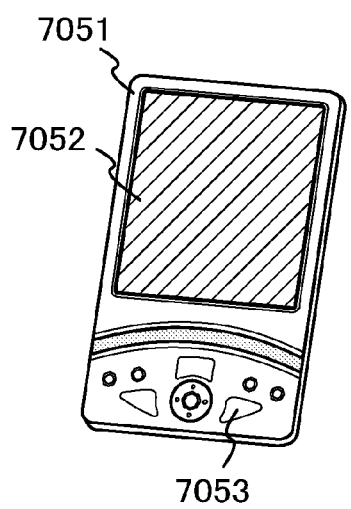

FIG. 16C illustrates a portable information terminal including a housing 7051, a display portion 7052, operation keys 7053, and the like. In the portable information terminal illustrated in FIG. 16C, a modem may be incorporated in the housing 7051. A liquid crystal display device in which a driving method according to an embodiment of the present invention is employed can be used for the display portion 7052. By using the liquid crystal display device in which a driving method according to an embodiment of the present invention is employed for the display portion 7052, the portable information terminal can have low power consumption and can display a high-quality image.

Figure 16D:
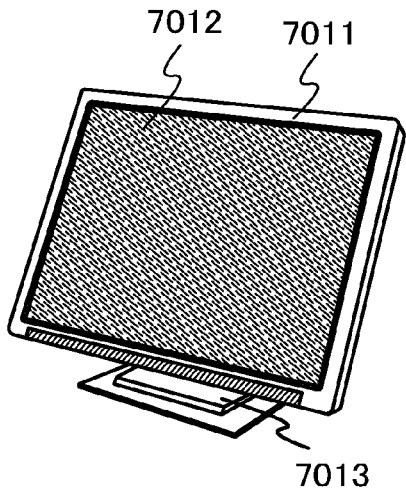

FIG. 16D illustrates a display device including a housing 7011, a display portion 7012, a supporting base 7013, and the like. A liquid crystal display device in which a driving method according to an embodiment of the present invention is employed can be used for the display portion 7012. By using the liquid crystal display device in which a driving method according to an embodiment of the present invention is employed for the display portion 7012, the display device can have low power consumption and can display a high-quality image. Note that the display device includes all of information display devices for personal computers, TV receivers, advertisement displays, and the like.

This example can be implemented in combination with any of the above-described embodiments as appropriate.

This application is based on Japanese Patent Application serial no. 2010-150889 filed with Japan Patent Office on Jul. 1, 2010, the entire contents of which are hereby incorporated by reference.

The invention claimed is:

1. A driving method of a liquid crystal display device comprising a plurality of pixels and a plurality of signal lines, the driving method comprising a step of:

inverting a polarity of an image signal, which is input to the plurality of pixels from the plurality of signal lines, every one frame period, wherein, in each frame period, the polarity of the image signal is different between any two pixels which are adjacent to each other with one of the plurality of signal lines positioned therebetween, wherein each of the plurality of pixels comprises a liquid crystal element comprising a pixel electrode and a transistor comprising a first terminal and a second terminal, wherein the transistor comprises a semiconductor having a wider band gap than a silicon semiconductor, wherein a value of an off-state current per 1 µm of a channel width of the transistor is less than or equal to 100 zA/µm under a condition at which a voltage between a source and a drain of the transistor is in a range of from 1V to 10V, wherein the transistor further comprises an insulating film over the semiconductor, wherein the insulating film comprises a metal oxide of a Group 13 element, and wherein a proportion of oxygen of the metal oxide is higher than a stoichiometric value.

2. The driving method according to claim 1, wherein the semiconductor has an intrinsic carrier density lower than that of the silicon semiconductor.

3. The driving method according to claim 1, wherein the semiconductor is an oxide semiconductor.

4. The driving method according to claim 1, wherein the semiconductor is an oxide semiconductor comprising zinc.

5. The driving method according to claim 1, wherein the semiconductor is an oxide semiconductor comprising gallium.

6. The driving method according to claim 1, wherein the semiconductor is an oxide semiconductor comprising zinc and gallium.

7. The driving method according to claim 1, wherein the semiconductor is an In—Ga—Zn—O-based oxide semiconductor.

8. The driving method according to claim 1, wherein, in each of the plurality of pixels, the first terminal of the transistor is electrically connected to one of the plurality of signal lines and the second terminal of the transistor is electrically connected only to the pixel electrode and the semiconductor.

9. The driving method according to claim 1, wherein the transistor further comprises a gate electrode, and wherein the insulating film is provided between the gate electrode and the semiconductor.

10. A driving method of a liquid crystal display device comprising a plurality of pixels, a plurality of signal lines, and a plurality of scan lines, the driving method comprising a step of:

inverting a polarity of an image signal, which is input to the plurality of pixels from the plurality of signal lines, every one frame period, wherein, in each frame period, the polarity of the image signal is different between any two pixels which are adjacent to each other with one of the plurality of signal lines positioned therebetween, wherein, in each frame period, the polarity of the image signal is the same in any two pixels which are adjacent to each other with one of the plurality of scan lines positioned therebetween, wherein each of the plurality of pixels comprises a liquid crystal element comprising a pixel electrode and a transistor comprising a first terminal and a second terminal, wherein the transistor comprises a semiconductor having a wider band gap than a silicon semiconductor, wherein a value of an off-state current per 1 μm of a channel width of the transistor is less than or equal to 100 zA/μm under a condition at which a voltage between a source and a drain of the transistor is in a range of from 1V to 10V, wherein the transistor further comprises an insulating film over the semiconductor, wherein the insulating film comprises a metal oxide of a Group 13 element, and wherein a proportion of oxygen of the metal oxide is higher than a stoichiometric value.

11. The driving method according to claim 10, wherein the semiconductor has an intrinsic carrier density lower than that of the silicon semiconductor.

12. The driving method according to claim 10, wherein the semiconductor is an oxide semiconductor.

13. The driving method according to claim 10, wherein the semiconductor is an oxide semiconductor comprising zinc.

14. The driving method according to claim 10, wherein the semiconductor is an oxide semiconductor comprising gallium.

15. The driving method according to claim 10, wherein the semiconductor is an oxide semiconductor comprising zinc and gallium.

16. The driving method according to claim 10, wherein the semiconductor is an In—Ga—Zn—O-based oxide semiconductor.

17. The driving method according to claim 10, wherein, in each of the plurality of pixels, the first terminal of the transistor is electrically connected to one of the plurality of signal lines and the second terminal of the transistor is electrically connected only to the pixel electrode and the semiconductor.

18. The driving method according to claim 10, wherein the transistor further comprises a gate electrode, and wherein the insulating film is provided between the gate electrode and the semiconductor.

19. A driving method of a liquid crystal display device comprising a plurality of pixels, a plurality of signal lines, and a plurality of scan lines, the driving method comprising a step of:

inverting a polarity of an image signal, which is input to the plurality of pixels from the plurality of signal lines, every one frame period, wherein, in each frame period, the polarity of the image signal is different between any two pixels which are adjacent to each other with one of the plurality of signal lines positioned therebetween, wherein, in each frame period, the polarity of the image signal is different between any two pixels which are adjacent to each other with one of the plurality of scan lines positioned therebetween, wherein each of the plurality of pixels comprises a liquid crystal element comprising a pixel electrode and a transistor comprising a first terminal and a second terminal, wherein the transistor comprises a semiconductor having a wider band gap than a silicon semiconductor, wherein a value of an off-state current per 1 μm of a channel width of the transistor is less than or equal to 100 zA/μm under a condition at which a voltage between a source and a drain of the transistor is in a range of from 1V to 10V, wherein the transistor further comprises an insulating film over the semiconductor, wherein the insulating film comprises a metal oxide of a Group 13 element, and wherein a proportion of oxygen of the metal oxide is higher than a stoichiometric value.

20. The driving method according to claim 19, wherein the semiconductor has an intrinsic carrier density lower than that of the silicon semiconductor.

21. The driving method according to claim 19, wherein the semiconductor is an oxide semiconductor.

22. The driving method according to claim 19, wherein the semiconductor is an oxide semiconductor comprising zinc.

23. The driving method according to claim 19, wherein the semiconductor is an oxide semiconductor comprising gallium.

24. The driving method according to claim 19, wherein the semiconductor is an oxide semiconductor comprising zinc and gallium.

25. The driving method according to claim 19, wherein the semiconductor is an In—Ga—Zn—O-based oxide semiconductor.

26. The driving method according to claim 19, wherein, in each of the plurality of pixels, the first terminal of the transistor is electrically connected to one of the plurality of signal lines and the second terminal of the transistor is electrically connected only to the pixel electrode and the semiconductor.

27. The driving method according to claim 19, wherein the transistor further comprises a gate electrode, and wherein the insulating film is provided between the gate electrode and the semiconductor.

28. A liquid crystal display device comprising a plurality of pixels over a substrate, at least one of the plurality of pixels comprising:

a signal line over the substrate;
a transistor comprising:
    a gate electrode over the substrate;
    a gate insulating film over the gate electrode, the gate insulating film comprising a metal oxide of a Group 13 element;
    a semiconductor film over the gate insulating film, the semiconductor film having a band gap wider than a silicon semiconductor; and
    a first conductive film and a second conductive film over the semiconductor film; and
a liquid crystal element comprising a pixel electrode, wherein a value of an off-state current per 1 μm of a channel width of the transistor is less than or equal to 100 zA/μm under a condition at which a voltage between a source and a drain of the transistor is in a range of from 1V to 10V, wherein the first conductive film is electrically connected to the signal line and the second conductive film is electrically connected to the pixel electrode, and wherein a proportion of oxygen of the metal oxide is higher than a stoichiometric value.

29. The liquid crystal display device according to claim 28,
wherein the semiconductor film has an intrinsic carrier density lower than that of the silicon semiconductor.

30. The liquid crystal display device according to claim 28,
wherein the semiconductor film is an oxide semiconductor.

31. The liquid crystal display device according to claim 28,
wherein the semiconductor film is an oxide semiconductor comprising zinc.

32. The liquid crystal display device according to claim 28,
wherein the semiconductor film is an oxide semiconductor comprising gallium.

33. The liquid crystal display device according to claim 28,
wherein the semiconductor film is an oxide semiconductor comprising zinc and gallium.

34. The liquid crystal display device according to claim 28,
wherein the semiconductor film is an In—Ga—Zn—O-based oxide semiconductor.

35. The liquid crystal display device according to claim 28,
wherein the second conductive film is electrically connected only to the pixel electrode and the semiconductor film.

* * * * *